(12) United States Patent
Kuo et al.

(10) Patent No.: US 12,256,575 B2
(45) Date of Patent: Mar. 18, 2025

(54) IMAGE SENSOR

(71) Applicant: VisEra Technologies Company Ltd., Hsin-Chu (TW)

(72) Inventors: Shin-Hong Kuo, Hsin-Chu (TW); Yu-Chi Chang, Hsin-Chu (TW); Zong-Ru Tu, Hsin-Chu (TW); Ching-Chiang Wu, Hsin-Chu (TW); Po-Hsiang Wang, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 431 days.

(21) Appl. No.: 17/834,706

(22) Filed: Jun. 7, 2022

(65) Prior Publication Data
US 2023/0154956 A1 May 18, 2023

Related U.S. Application Data

(60) Provisional application No. 63/279,882, filed on Nov. 16, 2021.

(51) Int. Cl.
*H10F 39/00* (2025.01)
*H10F 39/18* (2025.01)

(52) U.S. Cl.
CPC ......... *H10F 39/806* (2025.01); *H10F 39/182* (2025.01); *H10F 39/805* (2025.01); *H10F 39/8053* (2025.01); *H10F 39/8063* (2025.01); *H10F 39/807* (2025.01)

(58) Field of Classification Search
CPC .......... H01L 27/14625; H10F 39/806
See application file for complete search history.

(56) References Cited

U.S. PATENT DOCUMENTS

| | | | |
|---|---|---|---|
| 2002/0005471 A1* | 1/2002 | Suzuki | H01L 27/14645 257/E31.128 |
| 2017/0097510 A1 | 4/2017 | Sohn | |
| 2020/0045223 A1 | 2/2020 | Pang et al. | |
| 2021/0091130 A1 | 3/2021 | Bonakdar et al. | |
| 2021/0185286 A1 | 6/2021 | Pang et al. | |

FOREIGN PATENT DOCUMENTS

| | | |
|---|---|---|
| JP | H08503171 A | 4/1996 |
| JP | 2002006111 A | 1/2002 |
| JP | 2002280532 A | 9/2002 |
| JP | 2005328066 A | 11/2005 |
| JP | 2006013522 A | 1/2006 |
| JP | 2006261248 A | 9/2006 |
| JP | 2015065624 A | 4/2015 |
| JP | 2016171161 A | 9/2016 |
| JP | 2022121757 A | 8/2022 |
| KR | 20170041088 A | 4/2017 |
| KR | 20200141345 A | 12/2020 |
| TW | 201727880 | 8/2017 |

* cited by examiner

*Primary Examiner* — Zandra V Smith
*Assistant Examiner* — Molly K Reida
(74) *Attorney, Agent, or Firm* — LIU & LIU

(57) ABSTRACT

An image sensor includes a first pixel array. The first pixel array includes multiple photo diodes and a polyhedron structure. The polyhedron structure is located above the photo diodes, and the polyhedron structure includes a bottom facet, a top facet, and at least one side facet. The bottom facet is located between the side facet and the photo diodes, and an orthogonal projection of the polyhedron structure overlaps with photo diodes. The polyhedron structure is configured to divide an incident light into a plurality of light beams focused in the photo diodes.

20 Claims, 38 Drawing Sheets

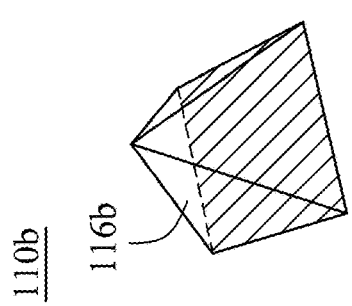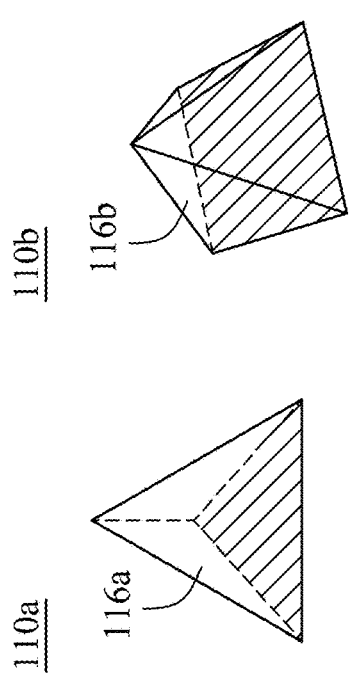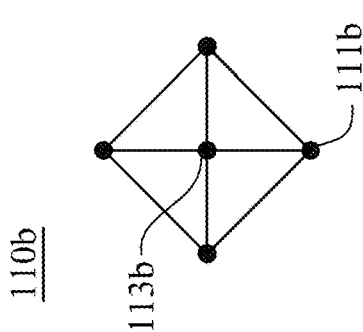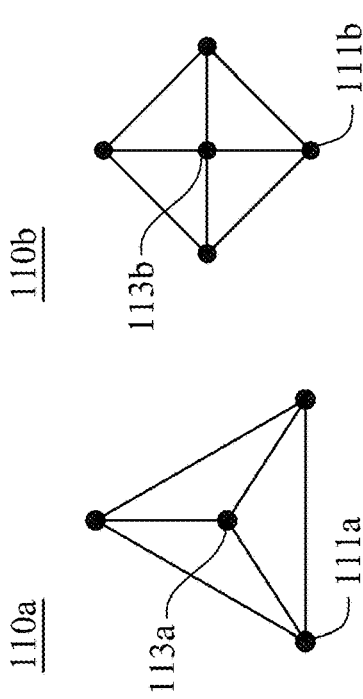

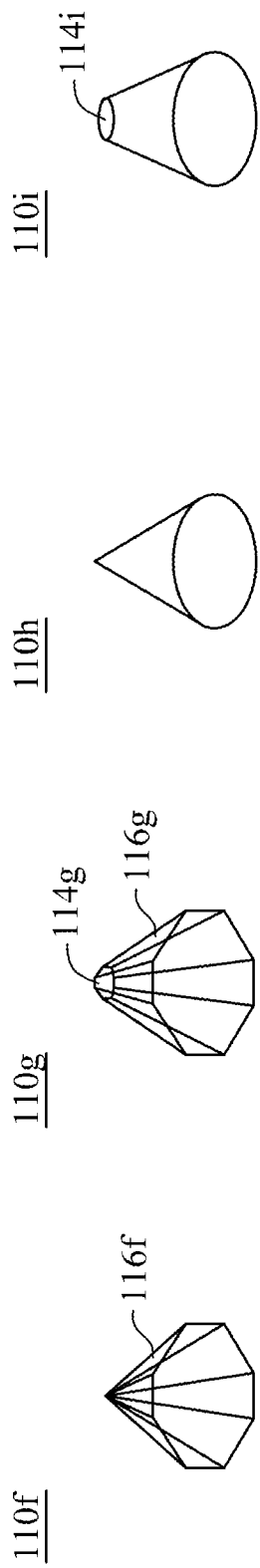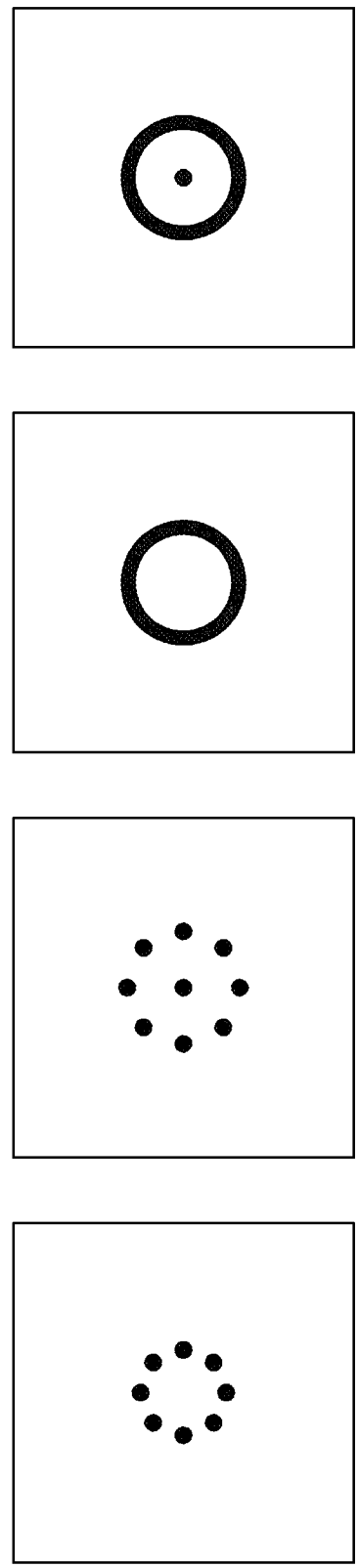

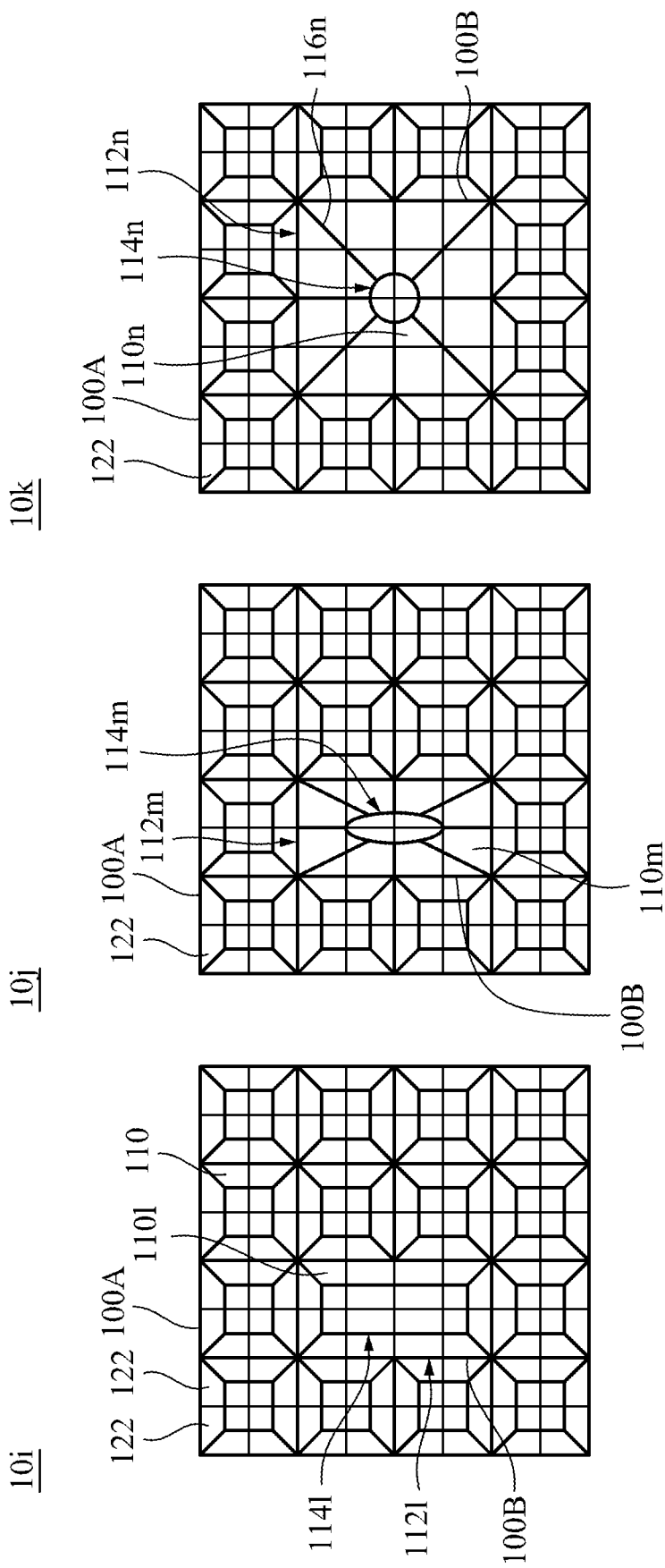

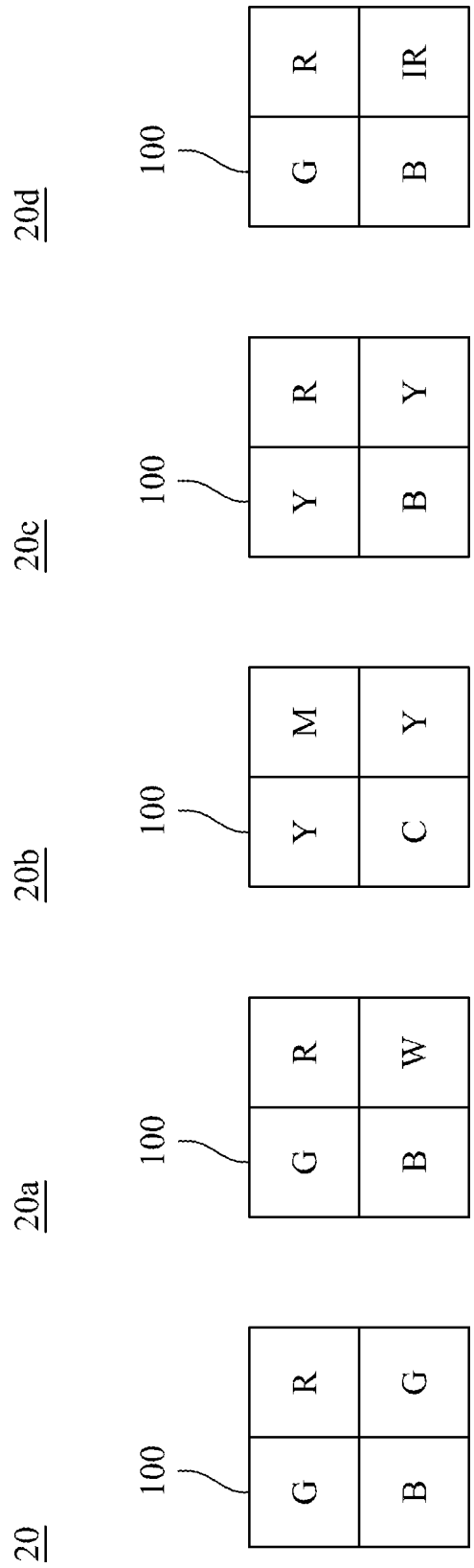

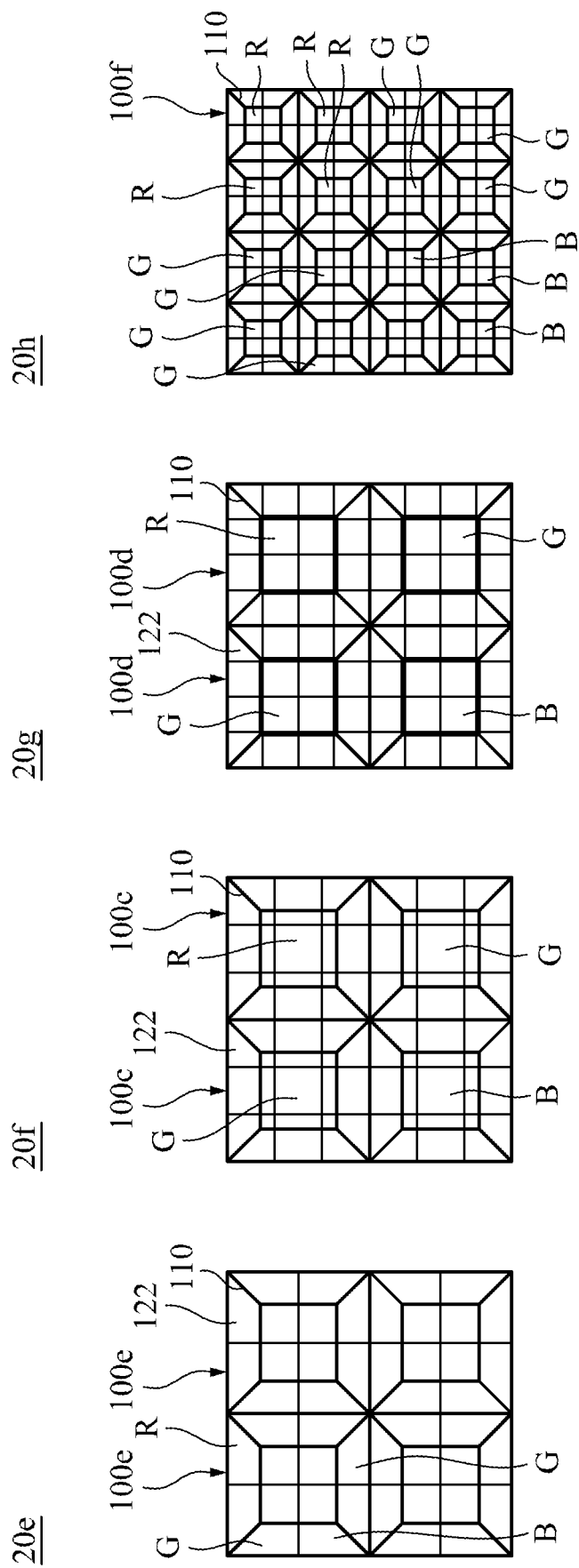

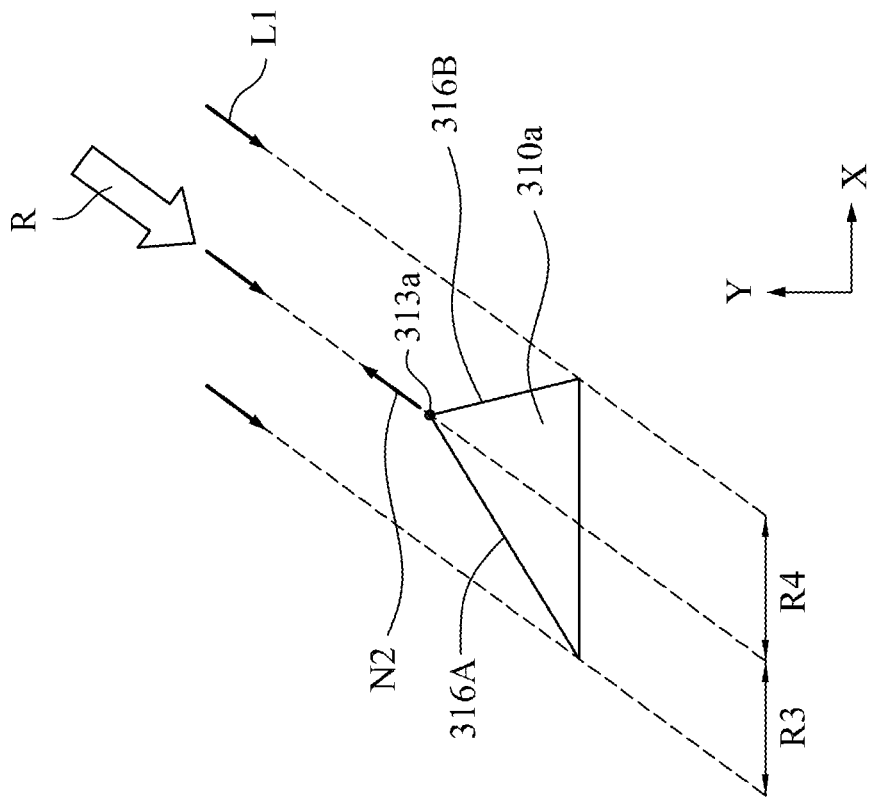
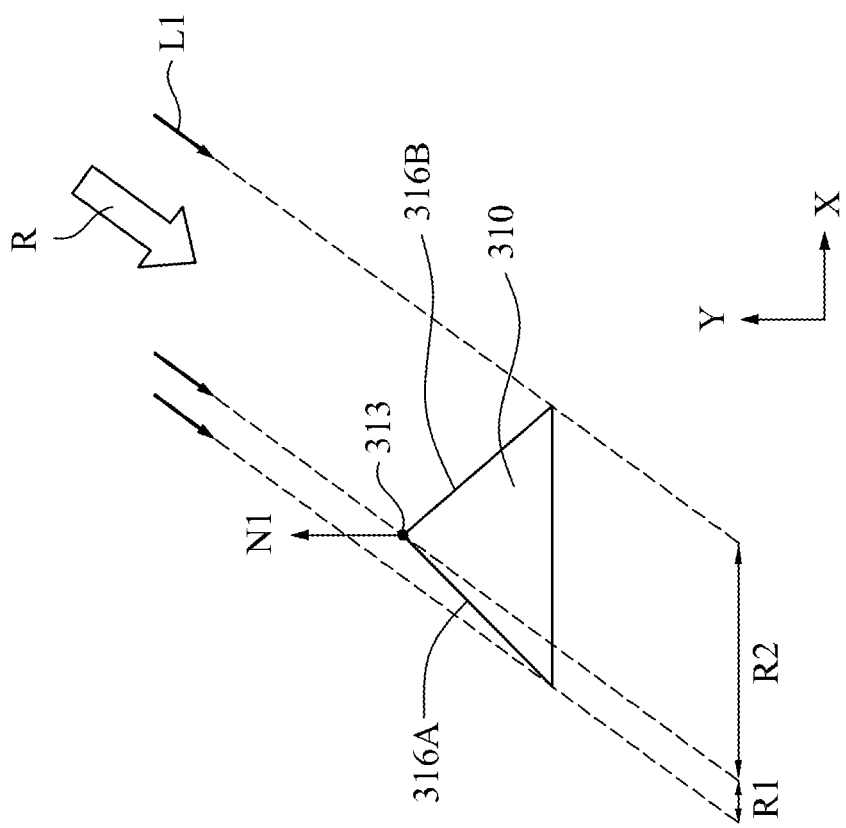

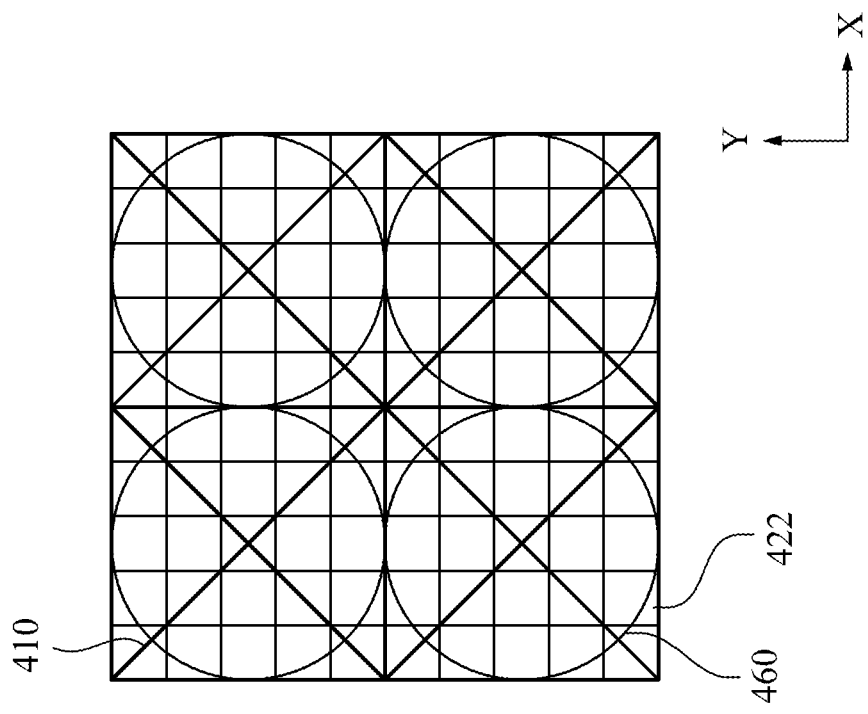
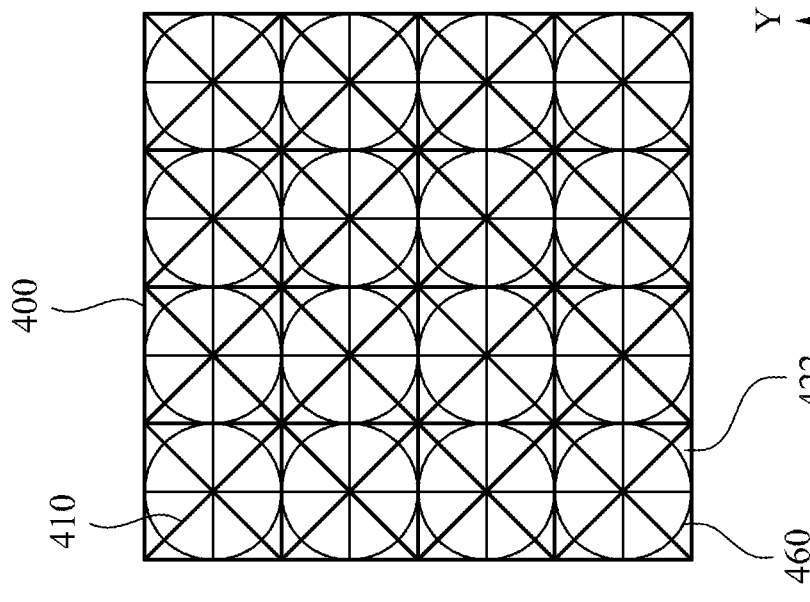
Fig. 25B
Fig. 25A

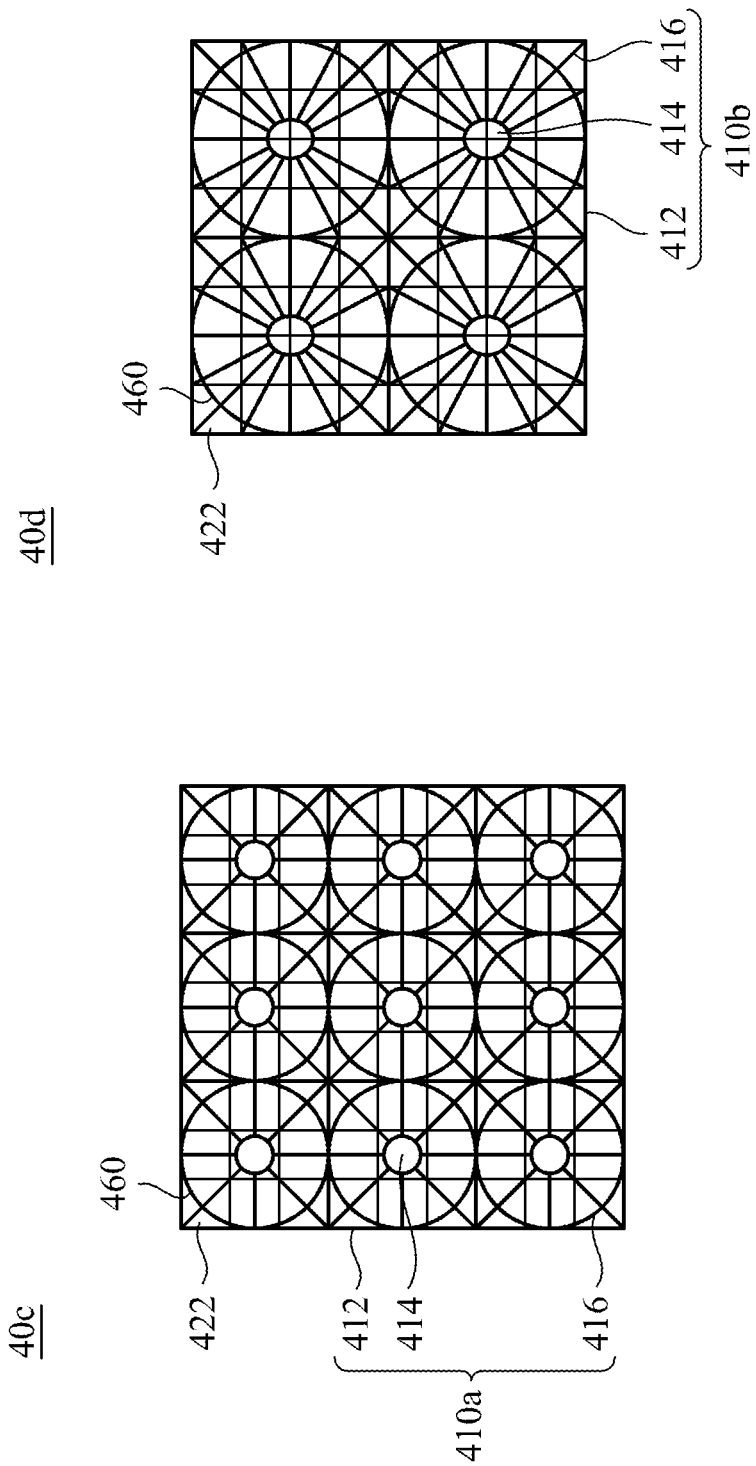

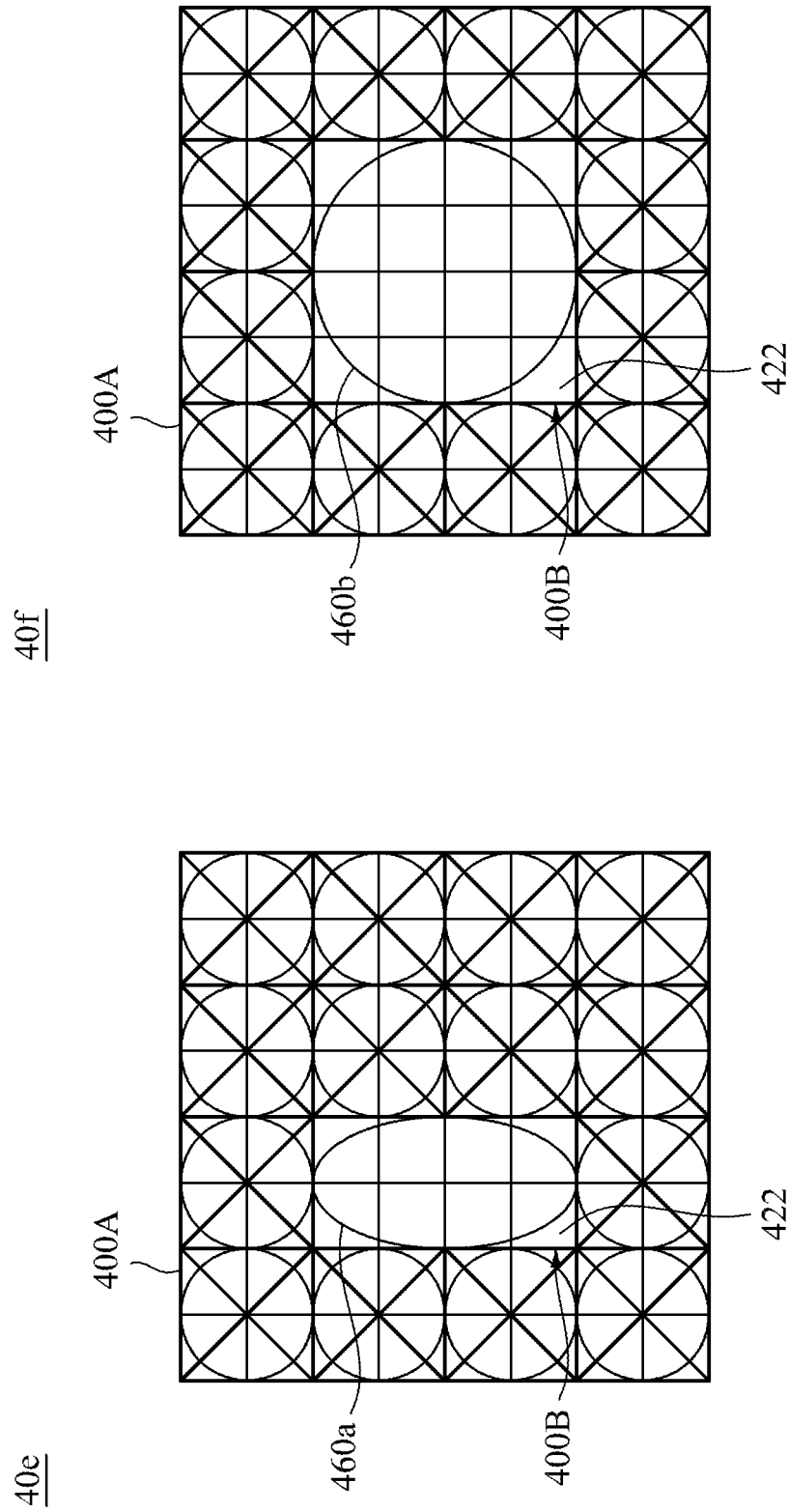

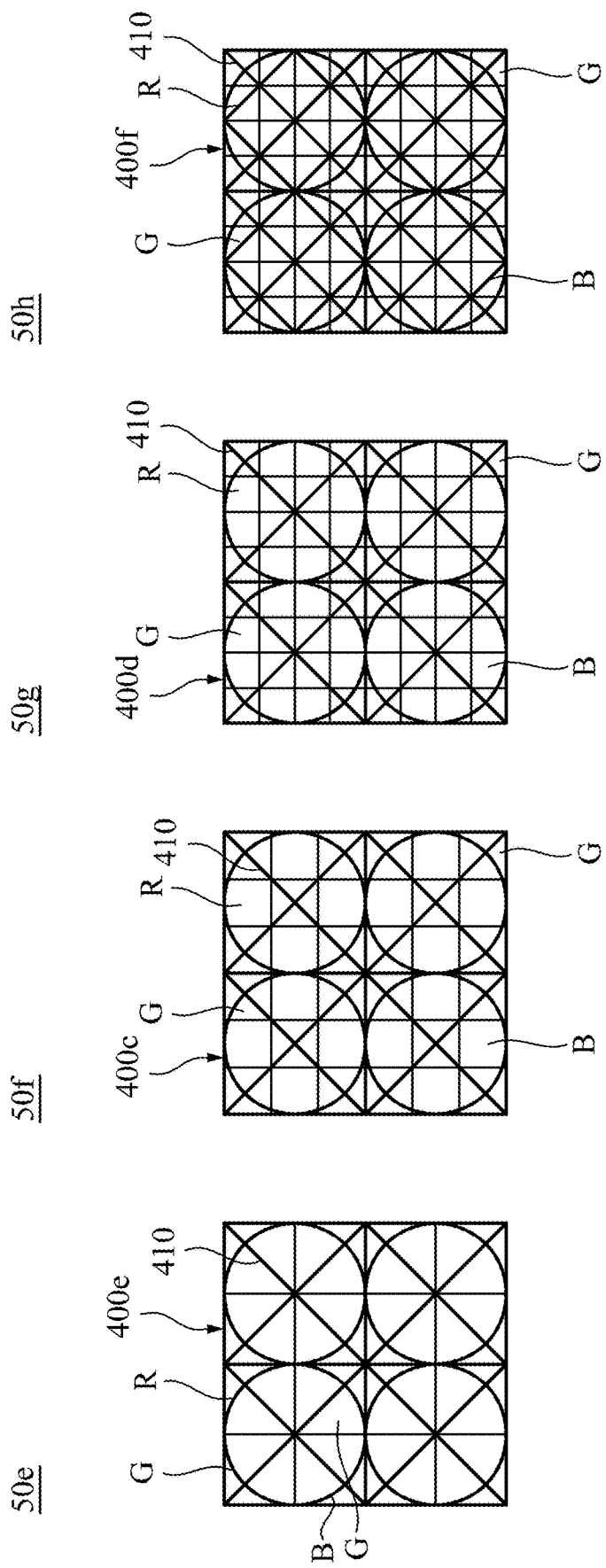

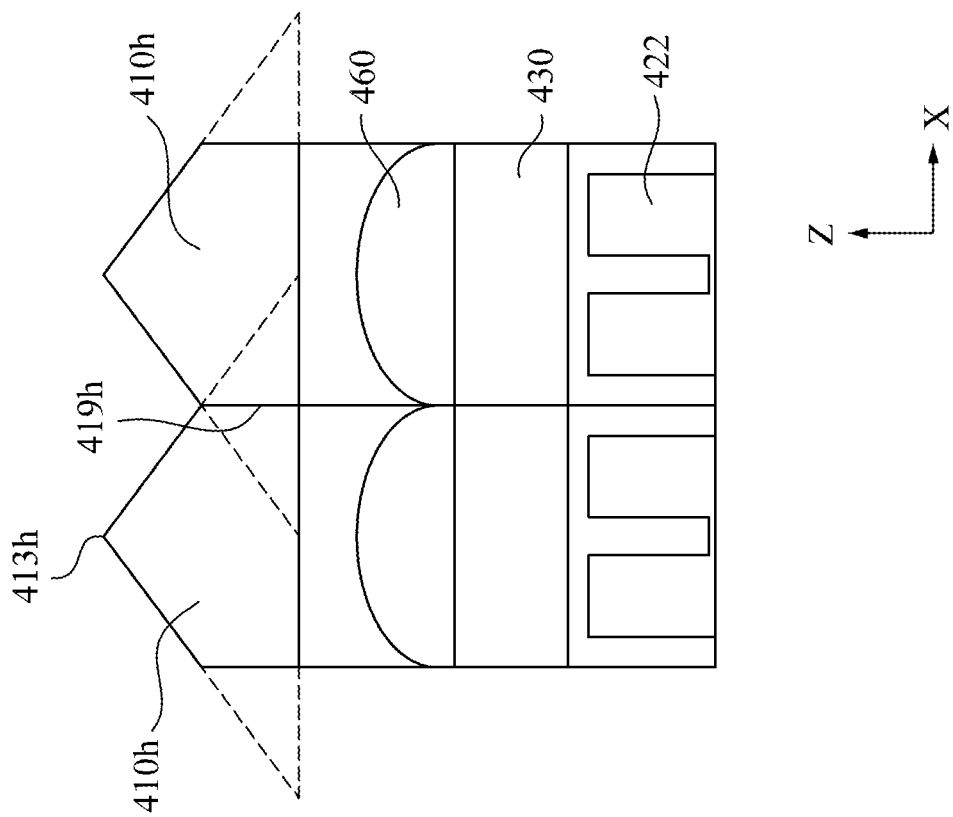
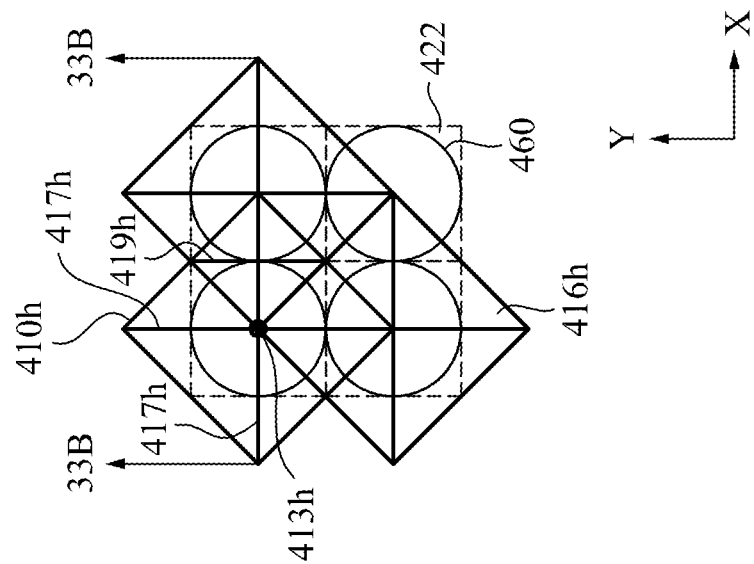
Fig. 33B
Fig. 33A

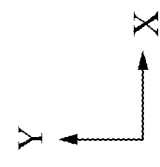
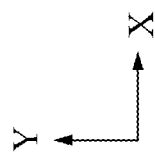
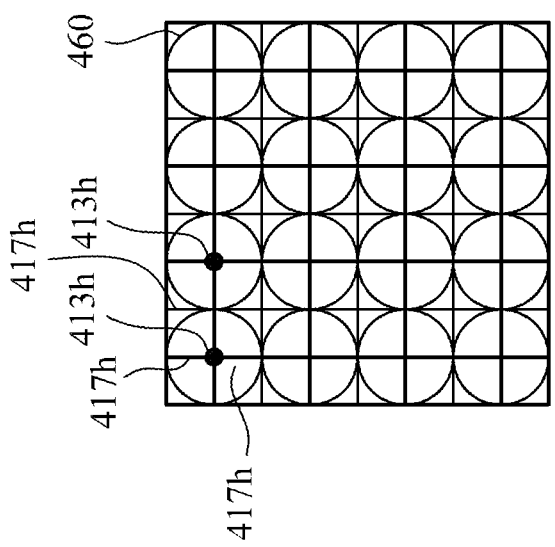
Fig. 33D
Fig. 33C

| Type | Diagram | | Electric field distribution on photo diode | | |
|---|---|---|---|---|---|
| | Top View | Side View | Wavelength: 450nm | Wavelength: 550nm | Wavelength: 650nm |
| Polyhedron structure & micro-lens Side facet: 4 Top facet: 0 | | | | | |
| Shift polyhedron structure & micro-lens Side facet: 4 Top facet: 0 | | | | | |

Fig. 37

IMAGE SENSOR

CROSS-REFERENCE TO RELATED APPLICATION

This application claims priority to U.S. Provisional Application Ser. No. 63/279,882, filed on Nov. 16, 2021, which is herein incorporated by reference in its entirety.

BACKGROUND

Field of Invention

The present invention relates to an image sensor.

Description of Related Art

An image sensor can detect and convey information used to make an image. Image sensors are used in various imaging devices such as digital cameras, optical mouse devices, medical imaging equipment, thermal imaging devices, radar, sonar, and so on.

A traditional image sensor may include a color filter, a micro lens, and multiple photo diodes. However, when three is a shift between the micro lens and the photo diodes, the energy received by the photo diodes will be uneven. As a result, performance of the photo diodes is degraded. Therefore, it is still a development direction for the industry to provide an image sensor which can solve the problem mentioned above.

SUMMARY

One aspect of the invention provides an image sensor.

In some embodiments, the image sensor includes a first pixel array. The first pixel array includes multiple photo diodes and a polyhedron structure. The polyhedron structure is located above the photo diodes. The polyhedron structure is configured to divide an incident light into multiple light beams, and each of the light beams is respectively focused in each of the photo diodes. The polyhedron structure includes a bottom facet, a top facet, and at least one side facet. The bottom facet is located between the side facet and the photo diodes, and an orthogonal projection of the polyhedron structure overlaps with the photo diodes.

In the aforementioned embodiment, the polyhedron structure is configured to divide an incident light into multiple light beams towards the photo diodes. In addition, a number of the light beam can be determined by a number of the side facets of the polyhedron structure. A position of the focus of the light beam can be determined by the area of the top facet of the polyhedron structure, the height of the polyhedron, or the refractive index of the polyhedron structure. As such, focuses of the light beams are positioned more correlated with positions of photo diodes. Therefore, performance of the photo diodes can be improved.

BRIEF DESCRIPTION OF THE DRAWINGS

The invention can be more fully understood by reading the following detailed description of the embodiment, with reference made to the accompanying drawings as follows:

FIGS. 4A to 4E are schematics of various polyhedron structures according to some embodiments of the present disclosure.

FIGS. 5A to 5E are top views of the polyhedron structures shown in FIGS. 4A to 4E.

FIGS. 6A to 6D are schematics of various polyhedron structures according to some embodiments of the present disclosure.

FIGS. 7A to 7D are illuminance diagram of the photo diodes in combination with the polyhedron structures shown in FIGS. 6A to 6D.

FIGS. 11A to 11B, FIGS. 12A to 12C, and FIGS. 13A to 13C are top views of image sensors according to some embodiments of the present disclosure.

FIGS. 16A to 16E are top views of color arrangement of the color filters of the image sensors according to some embodiments of the present disclosure.

FIGS. 17A to 17D are top views of color arrangement of the color filters of the image sensors according to some embodiments of the present disclosure.

FIG. 20A and FIG. 20B are schematics of light distribution on the polyhedron structure according to some embodiment of the present disclosure.

FIGS. 25A to 25B, FIGS. 26A to 26B, FIGS. 27A to 27B, FIGS. 28A to 28C, FIGS. 29A to 29B, FIGS. 30A to 30B, FIGS. 31A to 31E, and FIGS. 32A to 32D are top views of image sensors according to some embodiments of the present disclosure.

FIG. 33A is a partial top view of an image sensor according to one embodiment of the present disclosure.

FIG. 33B is a cross-sectional view taken along line 33B-33B in FIG. 33A.

FIG. 33C and FIG. 33D are top view of image sensors according to some embodiments of the present disclosure.

FIG. 37 is an electromagnetic field simulation result.

DETAILED DESCRIPTION

Figure 1:
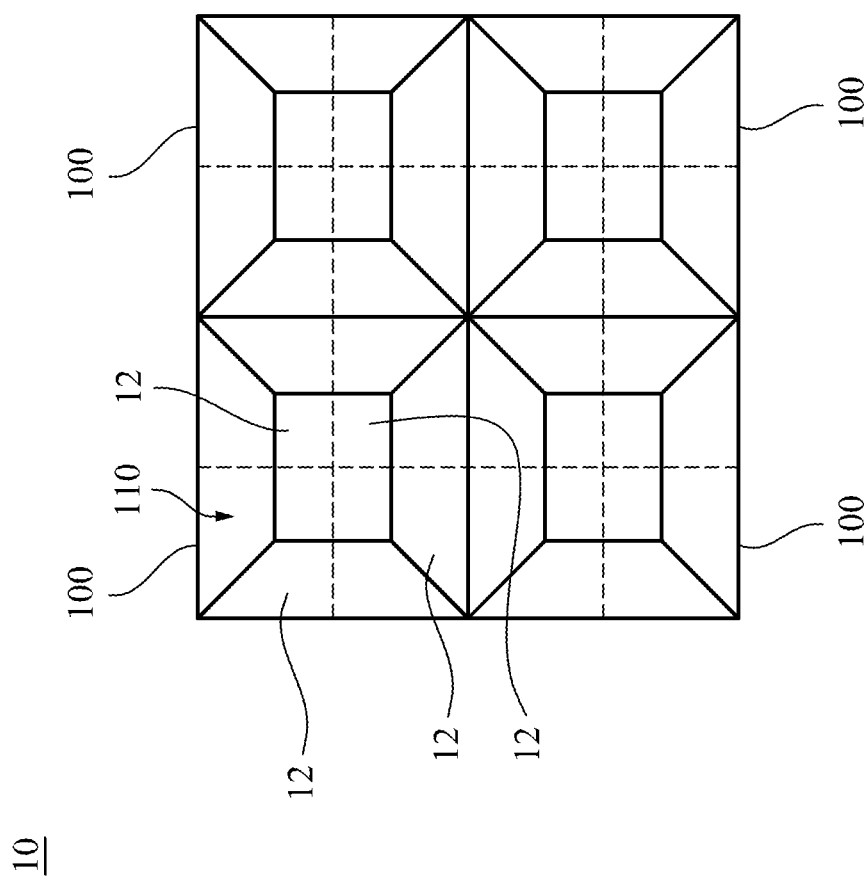
FIG. 1 is a top view of an image sensor 10 according to one embodiment of the present embodiment.

Reference will now be made in detail to the present embodiments of the invention, examples of which are illustrated in the accompanying drawings. Wherever possible, the same reference numbers are used in the drawings and the description to refer to the same or like parts.

Figure 2:
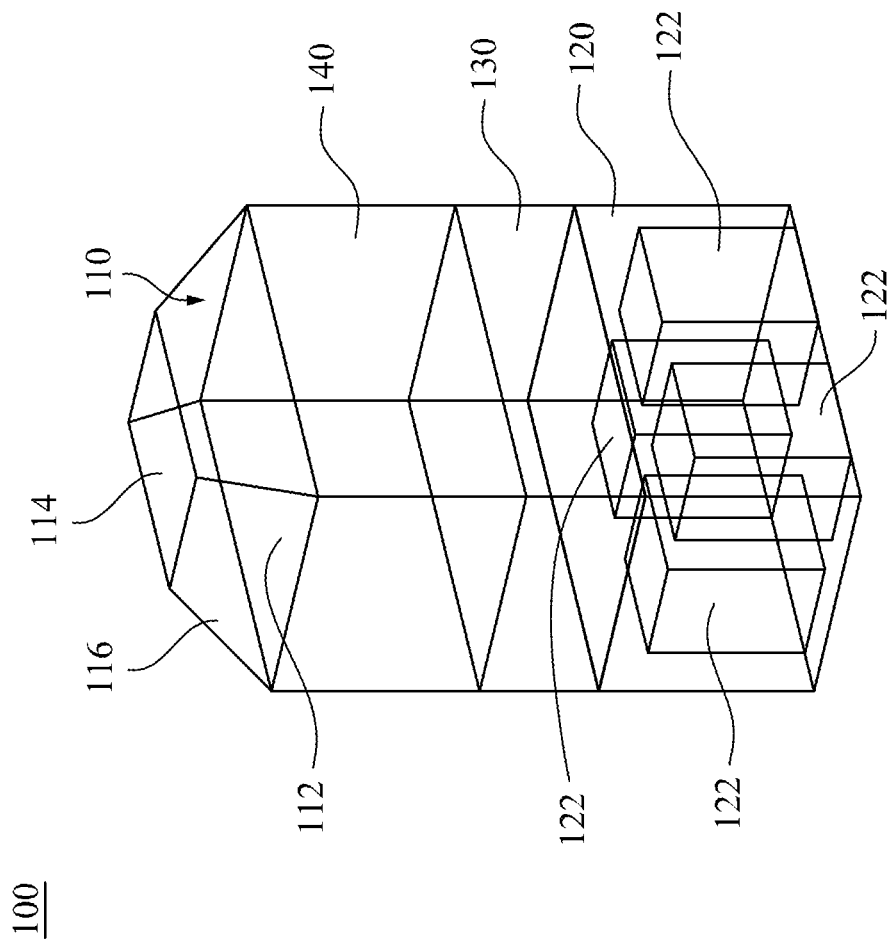
FIG. 2 is a three-dimensional view of a first pixel array 100 of the image sensor 10 in FIG. 1.

FIG. 1 is a top view of an image sensor 10 according to one embodiment of the present embodiment. FIG. 2 is a three-dimensional view of a first pixel array 100 of the image sensor 10 in FIG. 1. Reference is made to FIG. 1 and FIG. 2. The image sensor 10 includes four first pixel arrays 100. The first pixel array 100 is a multi photo diode structure applied in an image sensor such as CMOS image sensor (CIS). The first pixel array 100 includes a polyhedron structure 110, a photoelectric conversion layer 120, a color filter 130, and an under layer 140. The photoelectric conversion layer 120 includes multiple photo diodes 122. The polyhedron structure 110 is located above the photoelectric conversion layer 120, the under layer 140, and the color filter 130. The color filter 130 is located between the under layer 140 and the photoelectric conversion layer 120. The under layer 140 is located between the blue color filter layer 130 and the polyhedron structure 110.

The polyhedron structure 110 includes a bottom facet 112, a top facet 114, and at least one side facet 116. An area of the bottom facet 112 is greater than an area of the top facet 114, and a number of the side facets 116 is greater than or equal to three. The bottom facet 112 is located between the side facets 116 and the under layer 140. An orthogonal projection of the polyhedron structure 110 overlaps with more than or equal to two photo diodes 122. In the present embodiments, the polyhedron structure 110 has four side facets 116. In other words, the polyhedron structure 110 is a hexahedron. The polyhedron structure 110 is transparent, and the material of the polyhedron structure 110 includes photoresist, plastic, organic material, inorganic material, or other suitable materials.

In the present embodiment, the first pixel array 100 has four pixels 12, and each of the pixels 12 has one photo diode 122. Therefore, the orthogonal projection of the polyhedron structure 110 overlaps with four photo diodes 122. That is, the first pixel array 100 is a quad photo diode (QPD). In some embodiments, the under layer 140 and the filter layer 130 can be omitted, or other structures can be disposed between the polyhedron structure 110 and the photoelectric conversion layer 120.

Figure 3:
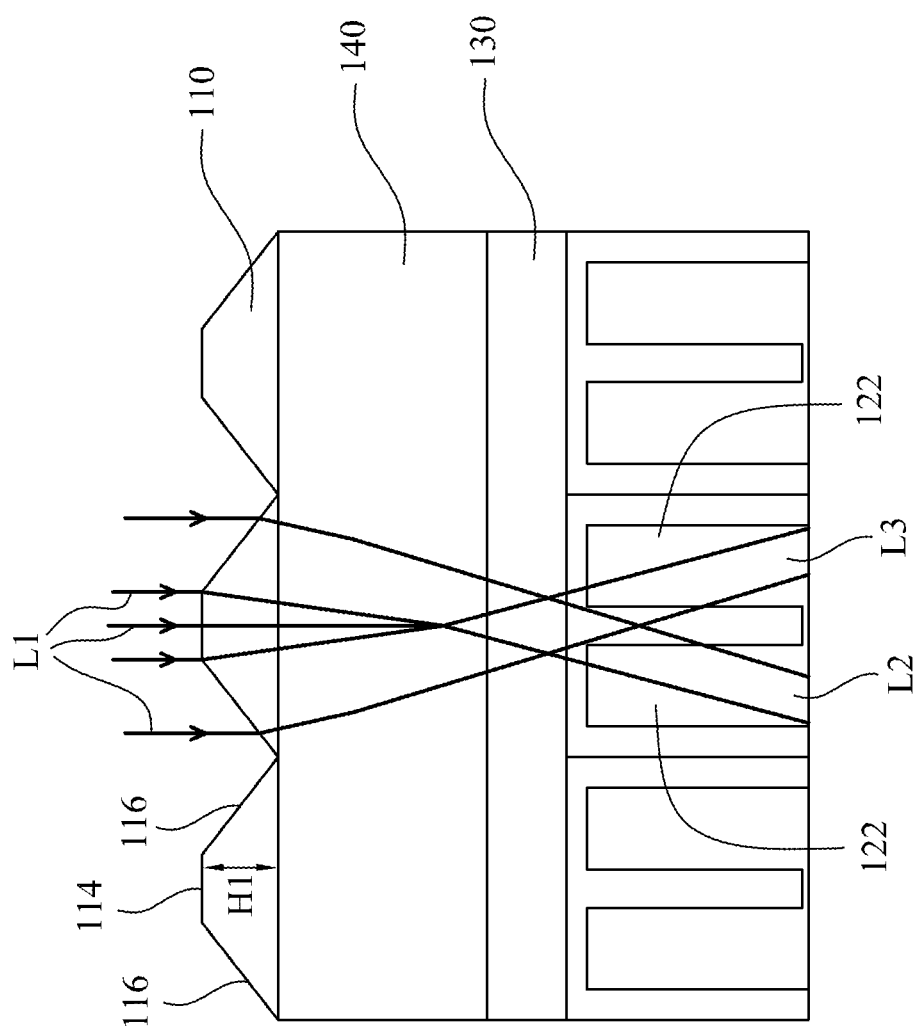
FIG. 3 is a schematic of optical path of an incident light traveling through a polyhedron structure.

FIG. 3 is a schematic of optical path of an incident light L1 traveling through a polyhedron structure 110. The polyhedron structure 110 is configured to divide an incident light L1 into multiple light beams. Each of the light beams is respectively focused in each of the photo diodes. The number of the light beam is determined by a number of the side facets 116 so as to improve performance of the photo diodes 122. For example, the polyhedron structure 110 can divide the incident light L1 into five light beams each passes through the side facets 116 and the top facet 114. Only three light beams are demonstrated in FIG. 3. A light beam L2 and a light beam L3 respectively travel toward the photo diodes 122, and a portion of the incident light L1 travels downward.

A position of the focus of the light beam is determined by the area of the top facet 114. For example, if a height H1 of the polyhedron structure 110 is fixed, the inclined level of the side facets 116 becomes greater when the area of the top facet 114 increases. As a result, focal lengths of the light beams L2, L3 are shorter. Therefore, the direction of the light beams L2, L3 can be adjusted by controlling the area of the top facet 114. As such, focuses of the light beams L2, L3 are positioned more correlated with positions of photo diodes.

FIGS. 4A to 4E are schematics of various polyhedron structures according to some embodiments of the present disclosure. FIGS. 5A to 5E are top views of the polyhedron structures shown in FIGS. 4A to 4E. As shown in FIG. 4A and FIG. 5A, the polyhedron structure 110a is a tetrahedron, and the polyhedron structure 110a has a triangular pyramid shape. The polyhedron structure 110a includes three vertexes 111a formed by the bottom facet 112a and the side facets 116a and a vertex 113a above the side facets 116a.

As shown in FIG. 4B and FIG. 5B, the polyhedron structure 110b is a pentahedron, and the polyhedron structure 110a has a quadrangular pyramid shape. The polyhedron structure 110b includes four vertexes 111b formed by the bottom facet 112b and the side facets 116b and a vertex 113b formed by the side facets 116b.

As shown in FIG. 4C and FIG. 5C, the polyhedron structure 110c is a pentahedron, and the polyhedron structure 110c has a triangular column shape. The polyhedron structure 110c includes three vertexes 111c formed by the bottom facet 112c and the side facets 116c and three vertexes 111c formed by the top facet 114c and the side facets 116c.

As shown in FIG. 4D and FIG. 5D, the polyhedron structure 110d is a pentahedron, and the polyhedron structure 110d has a roof shape. The polyhedron structure 110d includes four vertexes 111d formed by the bottom facet 112d and the side facets 116d and two vertexes formed by side facets 116d. As shown in FIGS. 4E and 5E, the polyhedron structure 110e is a hexahedron, and the polyhedron structure 110e has a pentagonal pyramid shape. The polyhedron structure 110e includes five vertexes 111e formed by the bottom facet 112e and the side facets 116e and a vertex 113e formed by the side facets 116e.

FIGS. 6A to 6D are schematics of various polyhedron structures according to some embodiments of the present disclosure. FIGS. 7A to 7D are illuminance diagram of the photo diodes in combination with the polyhedron structures shown in FIGS. 6A to 6D. As shown in FIG. 6A and FIG. 7A, the polyhedron structure 110f has eight side facets 116f, and therefore an incident light is divided into eight light beams. As shown in FIG. 6B and FIG. 7B, the polyhedron structure 110g has eight side facets 116g and a top facet 114g, and therefore an incident light is divided into nine light beams. As shown in FIG. 6C and FIG. 7C, the polyhedron structure 110h has a cone shape (i.e., infinite number of side facets), and therefore an incident light is reshaped as a ring-shaped light. As shown in FIG. 6D and FIG. 7D, the polyhedron structure 110i has a cone shape with a top facet 116i, and therefore an incident light is reshaped as a ring-shaped light and a light beam at the center of the ring-shaped light.

The polyhedron structure of the present discloser is not limited to those embodiments described above in FIGS. 4A to 44E and FIGS. 6A to 6D. Suitable shapes of the polyhedron structures can be used based on the arrangement of pixels so as improve performance of the photo diodes. As such, focuses of the light beams are positioned more correlated with positions of photo diodes.

Reference is made to FIG. 1. A refractive index of the polyhedron structure 110 is greater than or equal to 1.1 and is smaller than a refractive index of the photo diodes 122. Specifically, the refractive index of the photo diodes 122 is greater than a refractive index of the color filter 130, and the refractive index of the color filter 130 is greater than a refractive index of the under layer 140. The refractive index of the under layer 140 is greater than or equal to the refractive index of the polyhedron structure 110. With such configuration, light transmission efficiency and performance of the photo diodes 122 can be improved.

Figure 8:
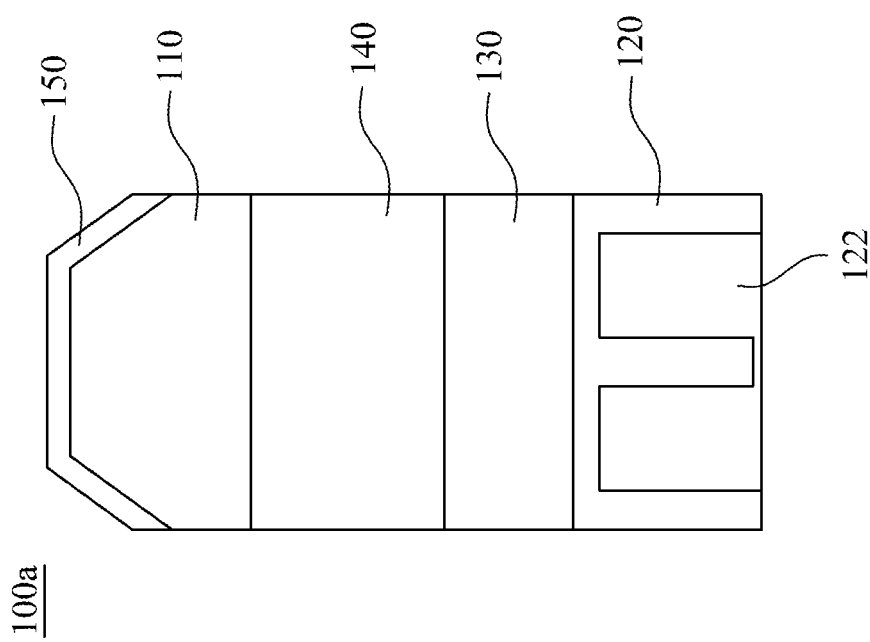
FIG. 8 is a side view of a first pixel array according to one embodiment of the present disclosure.

FIG. 8 is a side view of a first pixel array 100a according to one embodiment of the present disclosure. The first pixel array 100a is similar to the first pixel array 100 shown in FIG. 2, and the difference is that the first pixel array 100a further includes an antireflection layer 150 coated on the polyhedron structure 110. In the present embodiment, a refractive index of the antireflection layer 150 is greater than 1.1 and is smaller than a refractive index of the polyhedron structure 110. With such configuration, light transmission efficiency and performance of the photo diodes 122 can be further improved.

Figure 9A:
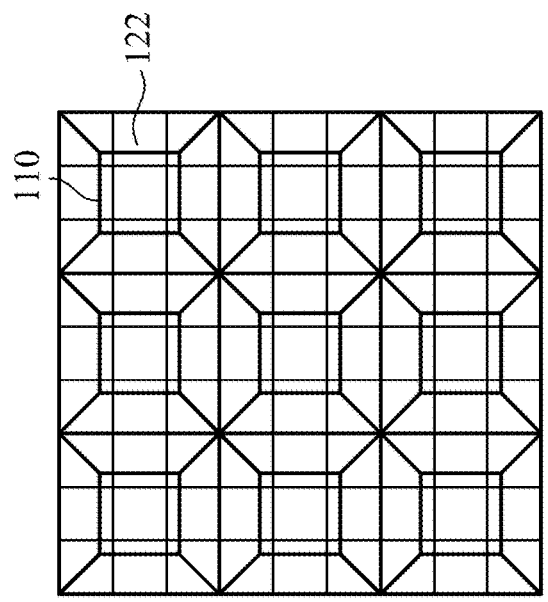
FIGS. 9A to 9D are top views of image sensors according to some embodiments of the present disclosure.
Figure 9B:
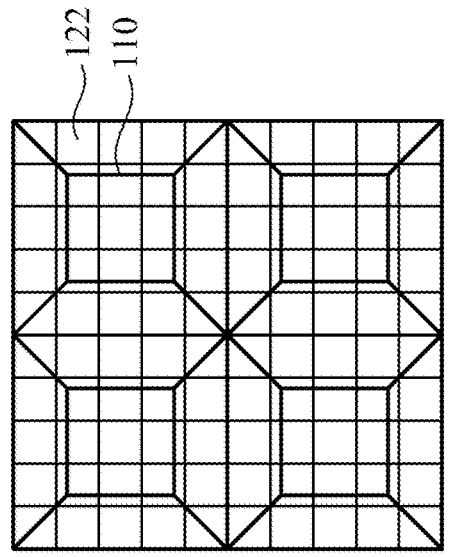
Figure 9C:
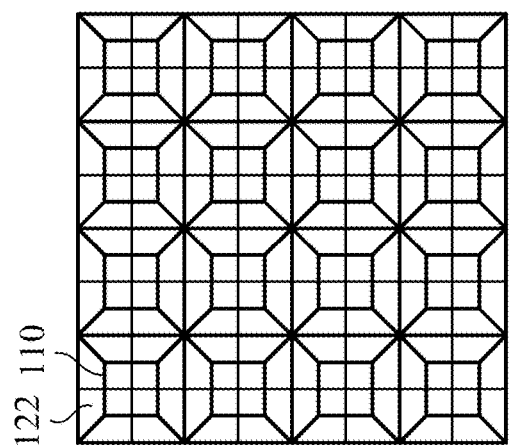
Figure 9D:
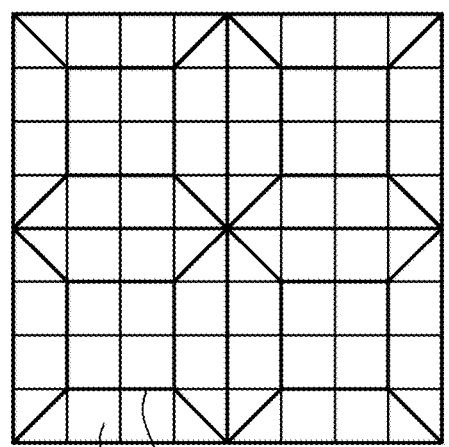

FIGS. 9A to 9D are top views of image sensors according to some embodiments of the present disclosure. As shown in FIG. 9A, the image sensor 10a has sixty-four photo diodes 122 (i.e., sixty-four pixels) and sixteen polyhedron structures 110. The polyhedron structures 110 are arranged as a 4×4 array. Each of the polyhedron structures 110 overlaps with four photo diodes 122 which are arranged as a 2×2 array. As shown in FIG. 9B, the image sensor 10b has eighty-one photo diodes 122 and nine polyhedron structures 110. The polyhedron structures 110 are arranged as a 3×3 array. Each of the polyhedron structures 110 is overlapped with nine photo diodes 122 which are arranged as a 2×2 array. As shown in FIG. 9C, the image sensor 10c has sixty-four photo diodes 122 and four polyhedron structures 110. The polyhedron structures 110 are arranged as a 2×2 array. Each of the polyhedron structures 110 overlaps with sixteen photo diodes 122 which are arranged as a 4×4 array. As shown in FIG. 9D, the image sensor 10d has one hundred photo diodes 122 and four polyhedron structures 110. The polyhedron structures 110 are arranged as a 2×2 array. Each of the polyhedron structures 110 overlaps with twenty-five photo diodes 122 which are arranged as a 5×5 array. The present disclosure is not limited to those configurations shown in FIGS. 9A to 9D.

Figure 10C:
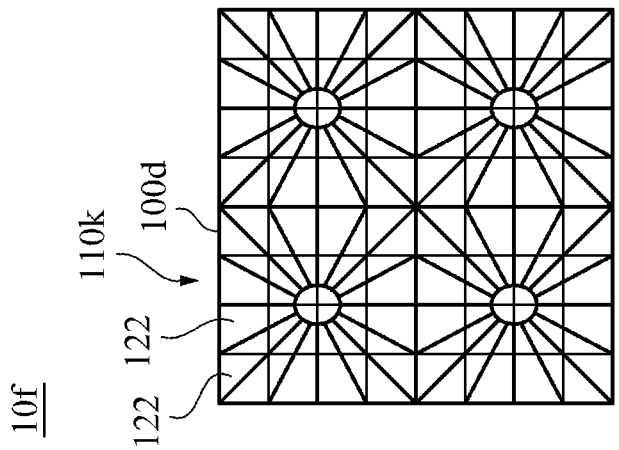
FIG. 10B and FIG. 10C are top views of image sensors according to some embodiments of the present disclosure.
Figure 10B:
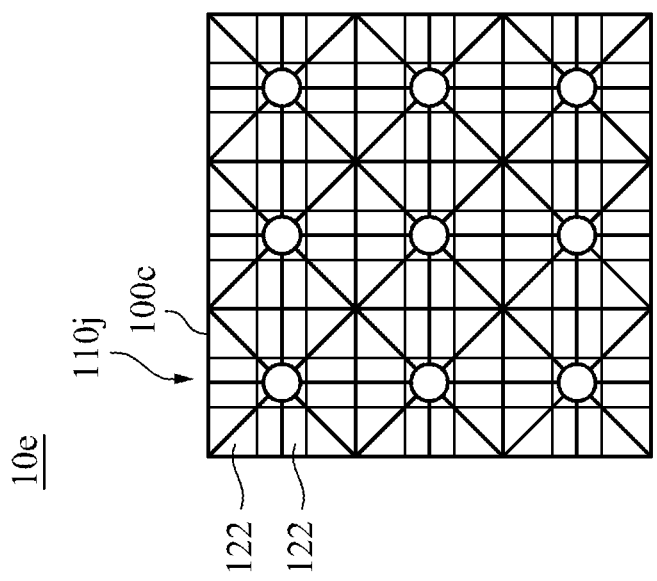
Figure 10A:
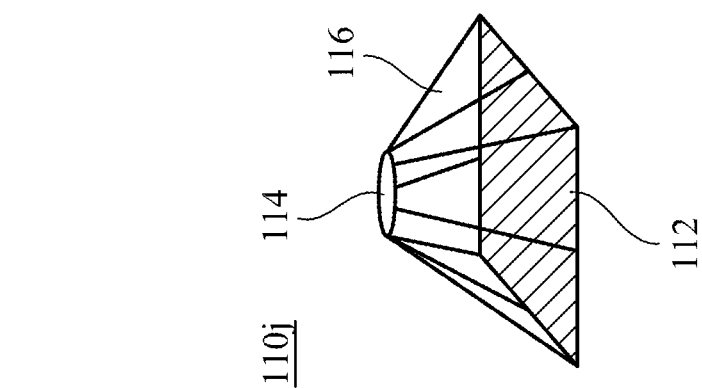
FIG. 10A is a schematic of a polyhedron structure.

FIG. 10A is a schematic of a polyhedron structure 110j. FIG. 10B and FIG. 10C are top views of image sensors according to some embodiments of the present disclosure. As shown in FIG. 10A and FIG. 10B, the image sensor 10e includes nine third pixel arrays 100c. Each of the third pixel arrays 100c includes one polyhedron structures 110j and nine photo diodes 122 (i.e., nine pixels). Each of the polyhedron structures 110j has eight side facets 116, a square bottom facet 112 and a circular top facet 114. Each of the polyhedron structures 110j overlaps with nine photo diodes 122 arranged as a 3×3 array. Therefore, a sum of a number of the side facets 116 and a number of the top facet 114 of the polyhedron structure 110j is equal to a number of the photo diodes 122.

As shown in FIG. 10C, the image sensor 10f has four fourth pixel arrays 100d. Each of the fourth pixel arrays 100d includes one polyhedron structure 110k and sixteen photo diodes 122. The polyhedron structure 110k is similar to polyhedron structure 110j, and the difference is that the polyhedron structure 110k has sixteen side facets 116. Each of the polyhedron structures 110k overlaps with sixteen photo diodes 122 arranged as a 4×4 array. Therefore, a sum of a number of the side facets 116 and a number of the top facet 114 of the polyhedron structure 110k equals to the number of the photo diodes 122.

In the embodiments shown in FIG. 10B and FIG. 10C, the polyhedron structure 110j and the polyhedron structure 110k are prism. The energy of an incident light can be distributed more uniformly to the one or more pixels underlying the top fact 114 and the pixels underlying the side facets 116.

Figure 11B:
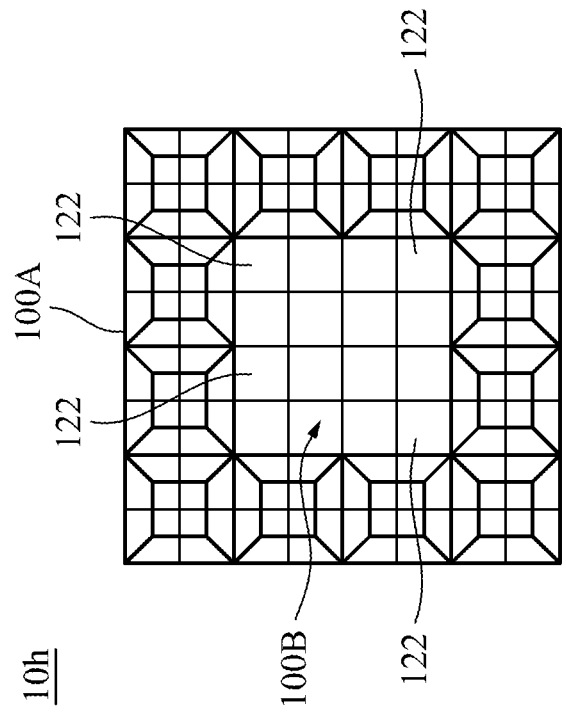
Figure 11A:
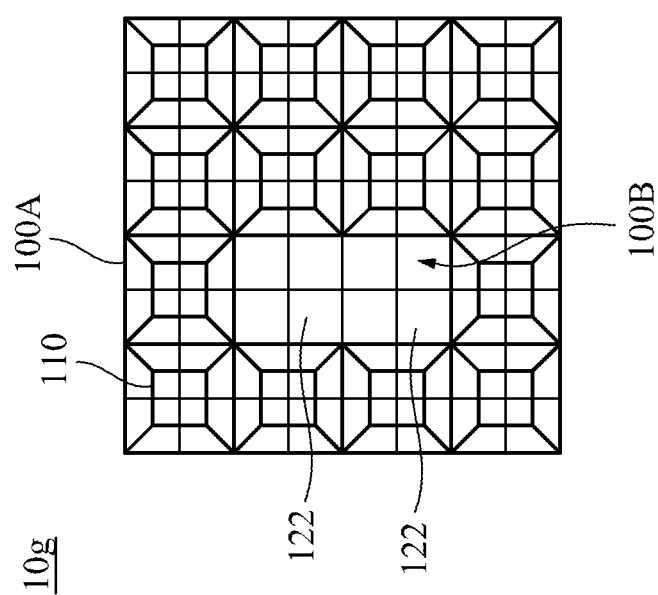

FIG. 11A and FIG. 11B are top views of image sensors according to some embodiments of the present disclosure. As shown in FIG. 11A, the image sensor 10g includes fourteen first pixel arrays 100A and one second pixel array 100B. The first pixel arrays 100A is the same as the first pixel array 100 described in FIG. 2. The second pixel array 100B has eight photo diodes 122 arranged as a 4×2 array, and there is no polyhedron structure 110 located above the photo diodes 122 of the second pixel array 100B. As shown in FIG. 11B, the image sensor 10h includes twelve first pixel arrays 100A and one second pixel array 100B. The second pixel array 100B includes sixteen photo diodes 122 arranged as a 4×4 array, and there is no polyhedron structures 110 located above the photo diodes 122 of the second pixel array 100B. The configurations of the image sensor 10g and the image sensor 10h can be utilized for specific functions such as auto focus function. In some other embodiments, the pixel arrays which have no polyhedron structures can be randomly arranged in the image sensor.

FIGS. 12A to 12C are top view of image sensors according to some embodiments of the present disclosure. As shown in FIG. 12A, the image sensor 10i includes fourteen first pixel array 100A and one second pixel array 100B. Each of the first pixel arrays 100A includes a polyhedron structure 110 and four photo diodes 122. Each of the polyhedron structure 110 overlaps with four photo diodes 122 as described in FIG. 1. The second pixel array 100B includes one polyhedron structure 110I and eight photo diodes 122 arranged as a 4×2 array. The polyhedron structure 110I has a rectangular top facet 114I and a rectangular bottom facet 112I. The polyhedron structure 110 and the polyhedron structure 110I are both Hexahedron, but a volume of the polyhedron structure 110I is greater than a volume of the polyhedron structure 110. In other words, a volume of the polyhedron structure 110 of the first pixel array 100A is different from a volume of the polyhedron structure 110I of the second pixel array 1001B. An area of the bottom facet 112 (see FIG. 2) of the polyhedron structure 110 of the first pixel array 100A is different from an area of the bottom facet 112I of the polyhedron structure 110I of the second pixel array 100B. An area of the top facet 114 (see FIG. 1) of the polyhedron structure 110 of the first pixel array 100A is different from an area of the top facet 114I of the polyhedron structure 110I of the second pixel array 100B.

As shown in FIG. 12B, the image sensor 10j is similar to the image sensor 10i shown in FIG. 12A, and the difference is that the top facet 114m of the polyhedron structure 110m has an elliptical shape. In other words, the polyhedron structure 110 of the first pixel array 100A and the polyhedron structure 110m of the second pixel array 100B have different shapes.

As shown in FIG. 12C, the image sensor 10k includes twelve first pixel array 100A and one second pixel array 100B. The second pixel array 100B has one polyhedron structure 110n and sixteen photo diodes 122 arranged as a 4×4 array. The polyhedron structure 110n has a circular top facet 114n and a rectangular bottom facet 112n. The polyhedron structure 110n has an octagonal column shape. In other words, a number of the side facets 116 of the polyhedron structure 110 of the first pixel array 100A is different from a number of the side facets 116n of the polyhedron structure 110n of the second pixel array 100B.

Figures 13A, 13B, 13C:
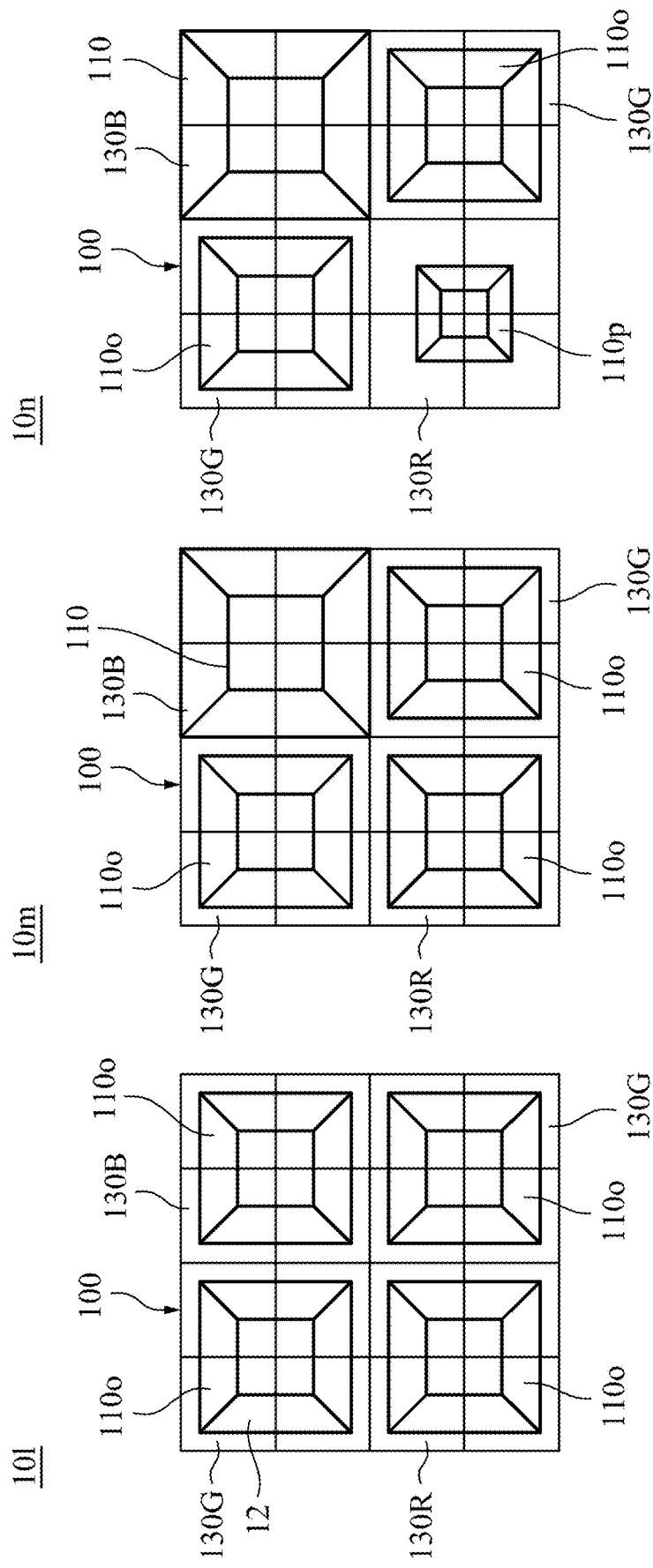

FIGS. 13A to 13C are top view of image sensors according to some embodiments of the present disclosure. As shown in FIG. 13A, the image sensor 10I includes four first pixel arrays 100. Each of the first pixel arrays 100 has a polyhedron structure 110o and four pixels 12. The image sensor 10I has a RGGB mosaic pattern. The upper-right first pixel array 100 has a blue color filter 130B, and the lower-left first pixel array 100 has a red color filter 130R. The other first pixel arrays 100 each has a green color filter 130G. In the present embodiment, the size of each of the polyhedron structure 110o is smaller than the size of the underlying layers. For example, as shown in the upper-right first pixel array 100, an area of an orthogonal projection of the polyhedron structure 110o is smaller than an area of the blue color filter 130B.

As shown in FIG. 13B, the image sensor 10m is similar to the image sensor 10I shown in FIG. 13A, and the difference is that the image sensor 10m has three polyhedron structures 110o and one polyhedron structure 110. The polyhedron structure 110 is located above the blue color filter 130B. The size of the polyhedron structure 110 is greater than the sizes of the polyhedron structures 110o. In the present embodiment, an area of an orthogonal projection of the polyhedron structure 110 on the blue color filter 130B is substantially the same as the area of blue the color filter 130B. With such design, energy efficiency of each of the pixel arrays 100 can be adjusted based on the color filter arrangement so as to improve performance of the image sensor 10m.

As shown in FIG. 13C, the image sensor 10n is similar to the image sensor 10m shown in FIG. 13B, and the difference is that the image sensor 10n has two polyhedron structures 110o, one polyhedron structure 110, and one polyhedron structure 110p above the red color filter 130R. The size of the polyhedron structure 110p is smaller than the sizes of the polyhedron structures 110o and the size of the polyhedron structures 110. With such design, energy efficiency of each of the pixel arrays 100 can be adjusted based on the color filter arrangement so as to improve performance of the image sensor 10m.

Figure 14B:
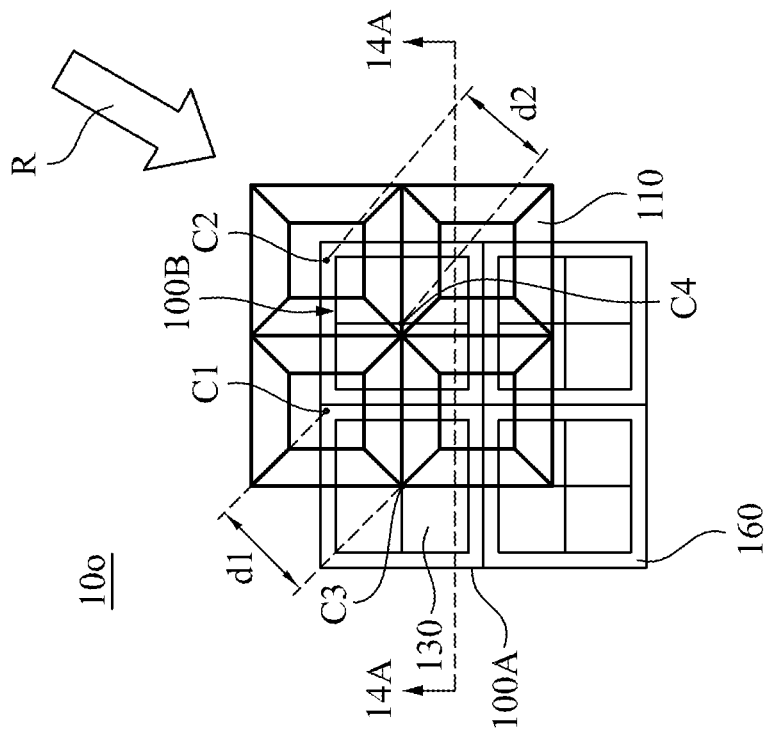
FIG. 14B is a top view of the image sensor in FIG. 14A.
Figure 14A:
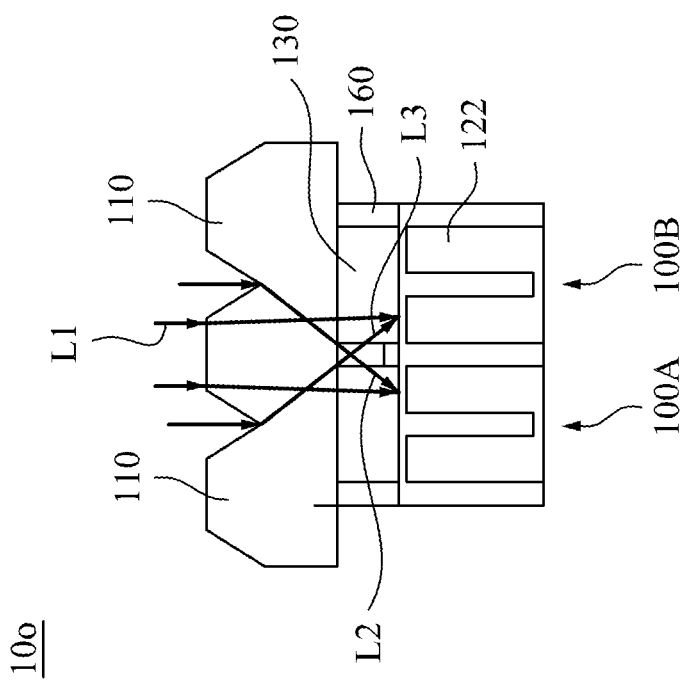
FIG. 14A is a side view of an image sensor 100 according to one embodiment of the present disclosure.

FIG. 14A is a side view of an image sensor 100 according to one embodiment of the present disclosure. FIG. 14B is a top view of the image sensor 100 in FIG. 14A. Reference is made to FIG. 14A and FIG. 14B, the image sensor 100 includes a first pixel array 100A and a second pixel array 100B. Each of the first pixel array 100A and the second pixel array 100B includes four photo diodes 122, a polyhedron structure 110, and a color filter 130 located between the photo diodes 122 and the polyhedron structure 110. The image sensor 100 further includes a grid 160 located between the color filters 130 of the first pixel array 100A and the second pixel array 100B. The polyhedron structure 110 has a translational shift relative to the color filter 130 and the photo diodes 122.

As shown in FIG. 14B, an orthogonal projection of the polyhedron structure 110 of the first pixel array 100A overlaps with the color filter 130 of the second pixel arrays 100B and the gird 160. As shown in FIG. 14A, the incident L1 can be divided into two light beams L2, L3 by the polyhedron structure 110 of the first pixel array 100A. The light beam L3 travels toward the photo diodes 122 of the second pixel array 100B, and the light beam L2 travels toward the photo diodes 122 of the first pixel array 100A. Accordingly, the image sensor 100 and the image sensor 10 have the same advantages.

As shown in FIG. 14B, a displacement d1 between a center C1 of the polyhedron structure 110 of the first pixel array 100A and a center C3 of the first pixel array 100A in the plan view is the same as a displacement d2 between a center C2 of the polyhedron structure 110 of the second pixel array 100B and a center C4 of the second pixel array 100B in the plan view. In some other embodiments, the displacement d1 and the displacement d2 can be different.

Figure 14D:
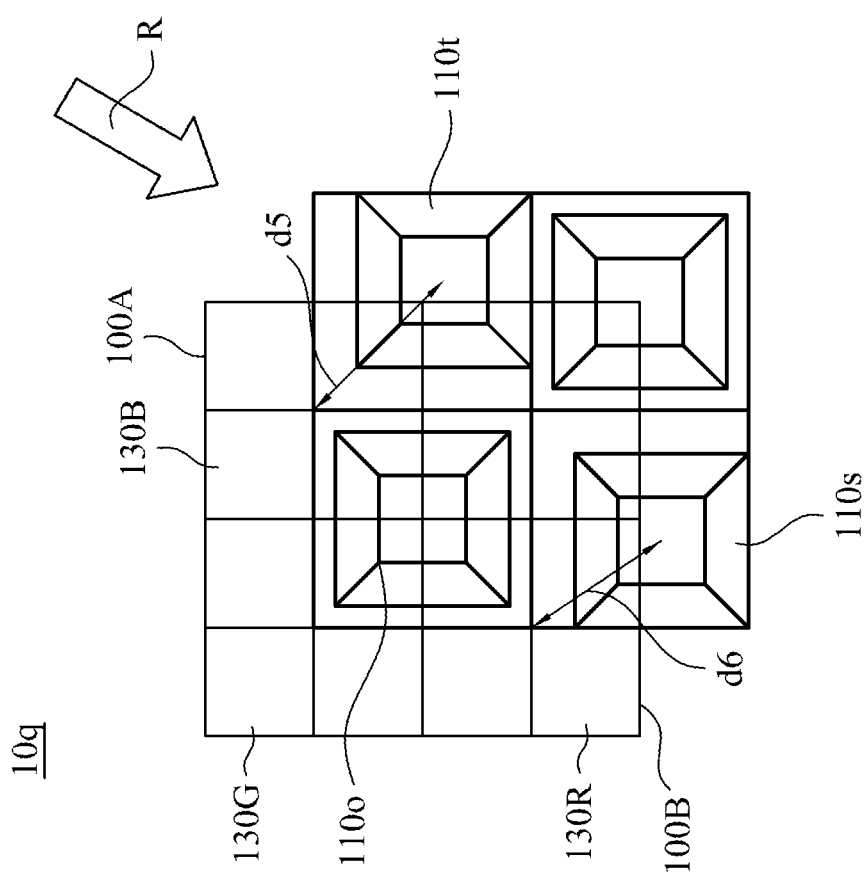
FIG. 14C and FIG. 14D are top views of the image sensors according to some embodiments of the present disclosure.
Figure 14C:
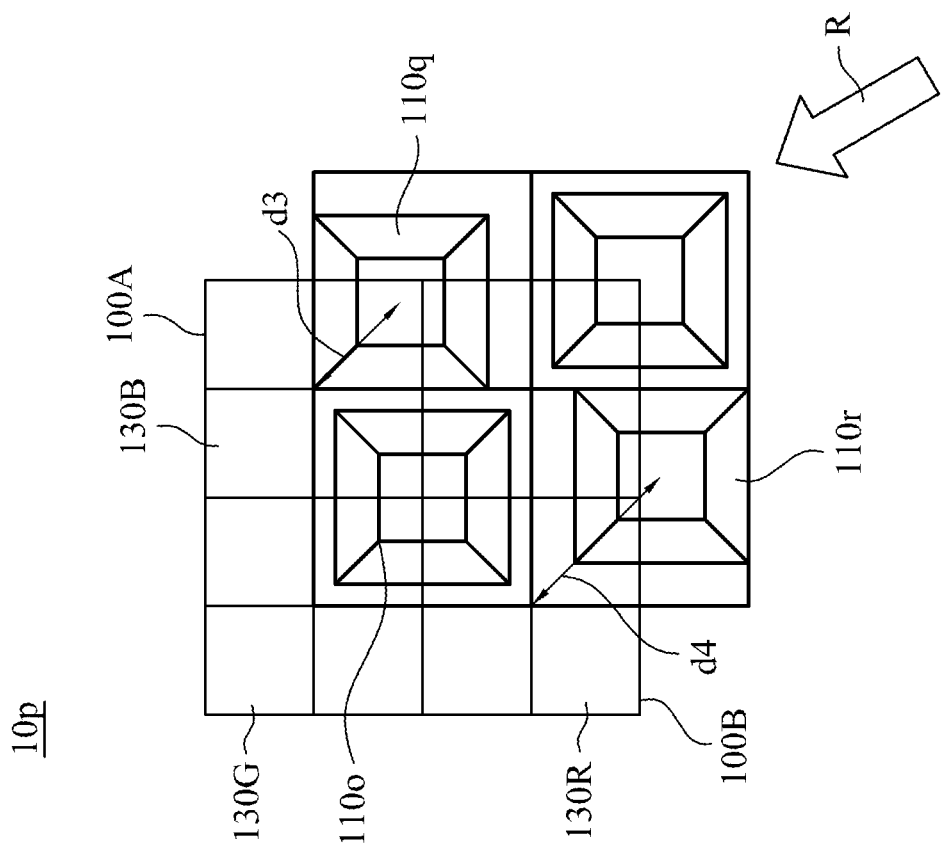

FIG. 14C and FIG. 14D are top views of the image sensors according to some embodiments of the present disclosure. As shown in FIG. 14C, the image sensor 10p includes a blue color filter 130B, a red color filter 130R, and two green color filters 130G. In the present embodiment, a displacement d3 between the center of the polyhedron structures 110 and the center of the first pixel array 100A is different from a displacement d4 between a center of the polyhedron structure 110 of the second pixel array 100B and a center of the second pixel array 100B. In other words, the displacement d3 between the polyhedron structure 110q and the first pixel array 100A having a blue color is different from the displacement d4 between the polyhedron structure 110r and the second pixel array 100B having a red color. As shown in FIG. 14D, the image sensor 10q is similar to the image sensor 10q. The displacement d5 and the displacement d6 are different from the displacement d3 and the displacement d4 based on the ray direction R of the incident light. In other words, the polyhedron structures 110 can have independent displacements relative to the centers of the pixel arrays. Accordingly, the displacements can be adjusted based on a ray direction R of the incident light and a color filter arrangement. With such configuration, the performance of the image sensor 10p and the image sensor 10q can be improved.

Figure 15A:
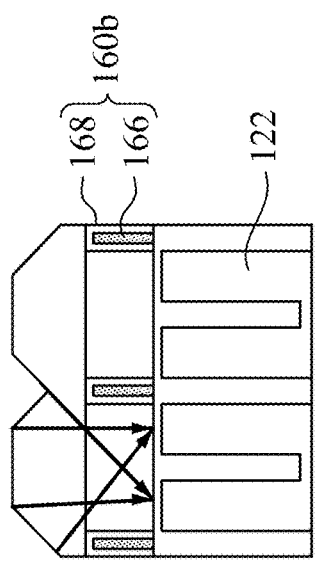
FIGS. 15A to 15E are cross-sectional views of image sensors according to some embodiments of the present disclosure.

FIGS. 15A to 15E are cross-sectional views of image sensors according to some embodiments of the present disclosure. As shown in FIG. 15A, the image sensor 10r includes two first pixel arrays 100. Each of the first pixel arrays 100 includes four photo diodes 122, a color filter 130, and a polyhedron structure 110. The image sensor 10r further includes a grid 160 surrounding the color filters 130. The grid 160 includes a body portion 162 and a metal layer portion 164. The metal layer portion 164 is located between the body portion 162 and the photo diodes 122. In some embodiments, a refractive index of the body portion 162 is greater than 1.5. In some other embodiments, a refractive index of the body portion 162 is greater than or equal to 1.0 and is smaller than 1.5.

Figure 15B:
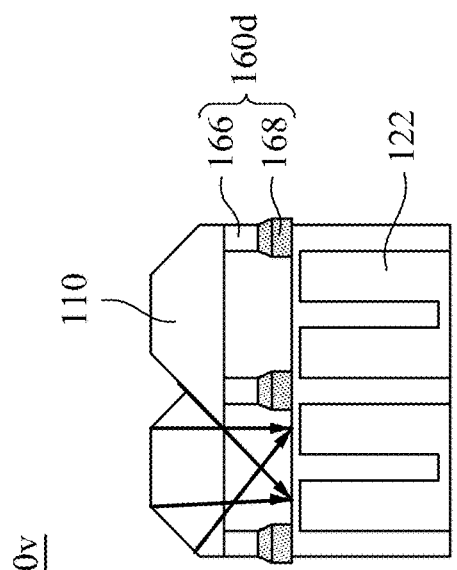

As shown in FIG. 15B, the image sensor 10s is similar to the image sensor 10r, and the difference is that the grid 160a of the image sensor 10s has no metal layer portion 164. The refractive index of the grid 160a is greater than or equal to 1.0 and is smaller than 1.5. Since the grid 160a has no metal layer and the refractive index is lower, the efficiency of the image sensor 10s can be improved.

Figure 15C:
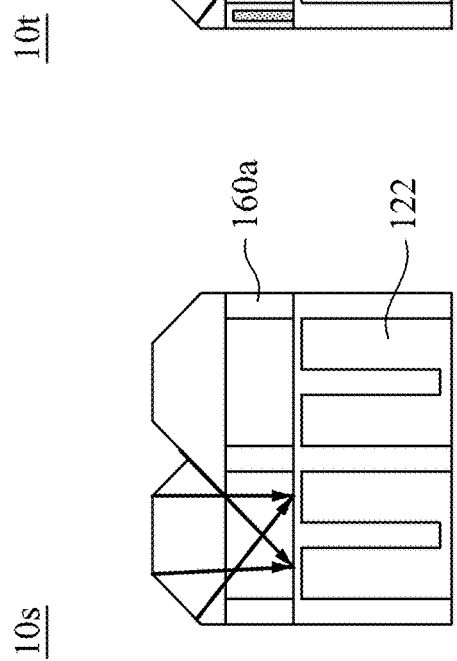

As shown in FIG. 15C, the image sensor 10t is similar to the image sensor 10s as shown in FIG. 15B, and the difference is that the grid 160b of the image sensor 10t includes a first layer 166 and a second layer 168, and the refractive indexes materials of the first layer 166 and the second layer 168 are different. For example, the refractive index of second layer 168 is greater than 1.5, and the refractive index of the first layer 166 is greater than or equal to 1.0 and is smaller than 1.5. In the present embodiment, the second layer 168 covers and surrounds the first layer 166. In other words, the first layer 166 is embedded in the second layer 168. Since the effective refractive index of the grid 160b is lower, the efficiency of the image sensor 10t can be improved.

Figure 15D:
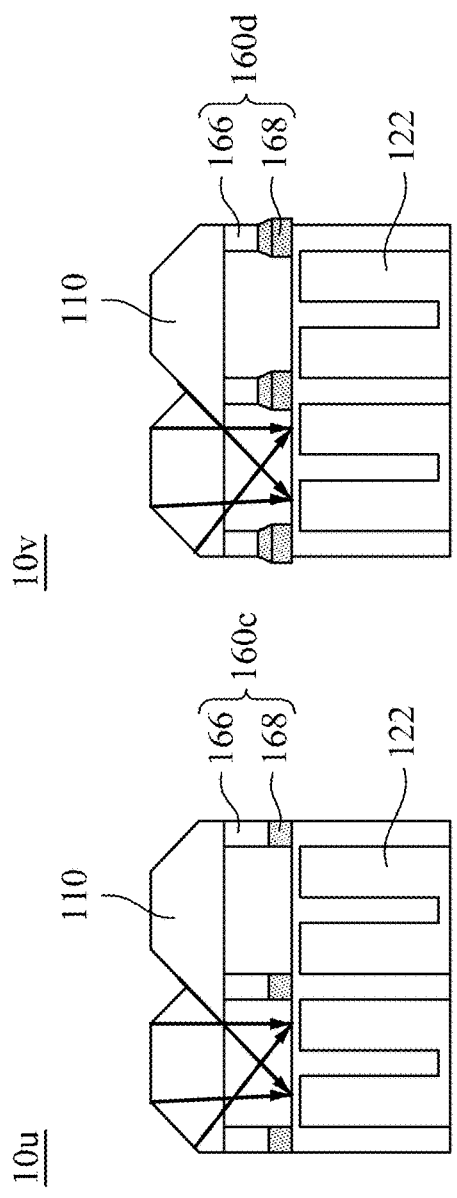

As shown in FIG. 15D, the image sensor 10u is similar to the image sensor 10t as shown in FIG. 15C, and the difference is the configuration of the grid 160c. In the present embodiment, the first layer 166 of the grid 160c is located above the second layer 168 of the grid 160c of the image sensor 10u. Since the refractive index of the grid 16c is lower, the efficiency of the image sensor 10u can be improved.

Figure 15E:
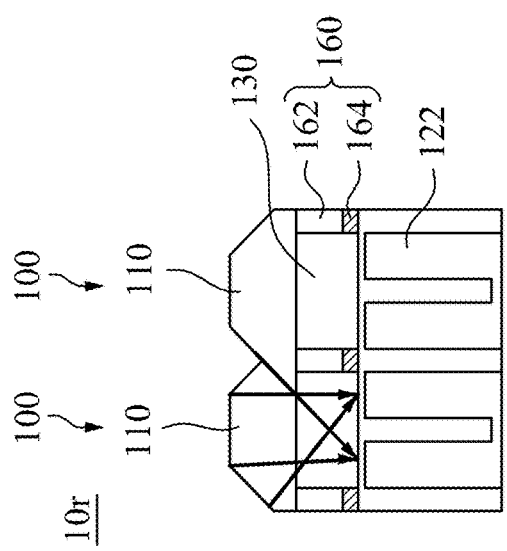

As shown in FIG. 15E, the image sensor 10v is similar to the image sensor 10u as shown in FIG. 15D, and the difference is the configuration of the grid 160d. In the present embodiment, the second layer 168 of the grid 160d has a greater diameter than a diameter of the first layer 166 of the grid 160d. Since the refractive index of the grid 160d is lower, the efficiency of the image sensor 10v can be improved.

FIGS. 16A to 16E are top views of color arrangement of the color filters of the image sensors according to some embodiments of the present disclosure. Each pixel arrays 100 shown in FIGS. 16A to 16E are substantially the same as the pixel array shown in FIG. 1 and FIG. 2. For convenience, only colors of the color filters are demonstrated herein, and the polyhedron structures and the photo diodes are omitted in FIGS. 16A to 16E. As shown in FIG. 16A, the image sensor 20 has a RGGB arrangement. That is, the image sensor 20 includes color filters corresponding to red, green, and blue. As shown in FIG. 16B, the image sensor 20a has a RGBW arrangement. That is, the image sensor 20a includes color filters corresponding to red, green, blue, and white. As shown in FIG. 16C, the image sensor 20b has a CYYM arrangement. That is, the image sensor 20b includes color filters corresponding to cyan, yellow, and magenta. As shown in FIG. 16D, the image sensor 20c has a RYYB arrangement. That is, the image sensor 20c includes color filters corresponding to red, yellow, and blue. As shown in FIG. 16E, the image sensor 20d has a RGBIR arrangement. That is, the image sensor 20d includes color filters corresponding to red, green, blue, and infrared.

FIGS. 17A to 17D are top views of image sensors according to some embodiments of the present disclosure. For convenience, only colors of the color filters are demonstrated herein. As shown in FIG. 17A, the image sensor 20e includes four fifth pixel arrays 100e. Each of the fifth pixel arrays 100e includes four pixels and has a RGGB arrangement. In other words, the polyhedron structure 110 of each of the fifth pixel array 100e overlaps with four photo diodes 122 and four color filters including different colors (red, green, and blue). That is, an orthogonal projection of each of the polyhedron structure 110 overlaps with the color filters having at least three colors.

As shown in FIG. 17B, the image sensor 20f includes four third pixel arrays 100c. Each of the third pixel arrays 100c includes one polyhedron structure 110 and nine photo diodes 122 (i.e., nine pixels), and each of the third pixel arrays 100c has single color. In other words, the polyhedron structure 110 of each of the third pixel array 100c overlaps with nine photo diodes 122 and one color filter. The four third pixel arrays 100c of the image sensor 20f collectively form a RGGB arrangement as shown in FIG. 16A. In some other embodiments, the image sensor 20f can have other types of color arrangements such as those arrangements shown in FIGS. 16B to 16E.

As shown in FIG. 17C, the image sensor 20g includes four fourth pixel arrays 100d. Each of the fourth pixel arrays 100d includes sixteen photo diodes 122, and each of the fourth pixel arrays 100d has single color. In other words, the polyhedron structure 110 of each of the fourth pixel array 100d overlaps with sixteen photo diodes 122 and color filter. The four fourth pixel arrays 100d of the image sensor 20g collectively form a RGGB arrangement as shown in FIG. 16A. In some other embodiments, the image sensor 20g can have other types of color arrangements such as those arrangements shown in FIGS. 16B to 16E.

As shown in FIG. 17D, the image sensor 20h includes four sixth pixel arrays 100f. Each of the sixth pixel arrays 100f is similar to the image sensor 20e shown in FIG. 17A, and the difference is that each of the sixth pixel arrays 100f has single color. In other words, four polyhedron structures 110 of each of the sixth pixel arrays 100f collectively overlap with one color filter. That is, an orthogonal projection of more than one polyhedron structure 110 overlaps with one color filter. The four sixth pixel arrays 100f of the image sensor 20h collectively form a RGGB arrangement as shown in FIG. 16A. In some other embodiments, the image sensor 20h can have other types of color arrangements such as those shown in FIGS. 16B to 16E.

Alternatively, the sixth pixel arrays 100f in FIG. 17D can be considered as a combination of a single color filter and four pixel arrays, and each of the pixel arrays includes one polyhedron structure 110 and four photo diodes 122. Therefore, at least one of the polyhedron structures of these four pixel arrays overlaps with the same color filter.

Figure 18:
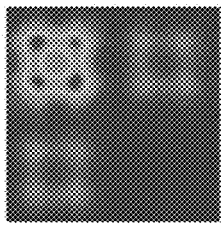
FIG. 18 is an electromagnetic field simulation result.

FIG. 18 is an electromagnetic field simulation result. FIG. 18 represents the electric field distributions on the photo diodes of an image sensor 10 as shown in FIG. 1 and FIG. 2 when the wavelength of an incident light is 450 nm (blue), 550 nm (green), and 650 nm (red), respectively. The image sensor 10 only has a polyhedron structure 110 and has no micro lens. The electric field distribution of the image sensor 10 shows multiple peaks, and positions of those peaks are correlated with the pixel arrangements. That is, energy of the incident light can be divided by the polyhedron structures of the image sensor 10 based on the pixel arrangement. As such, the energy received by each photo diodes 122 is even. Therefore, the configuration of the image sensor of the present disclosure can improve the performance of the photo diodes.

Figure 19:
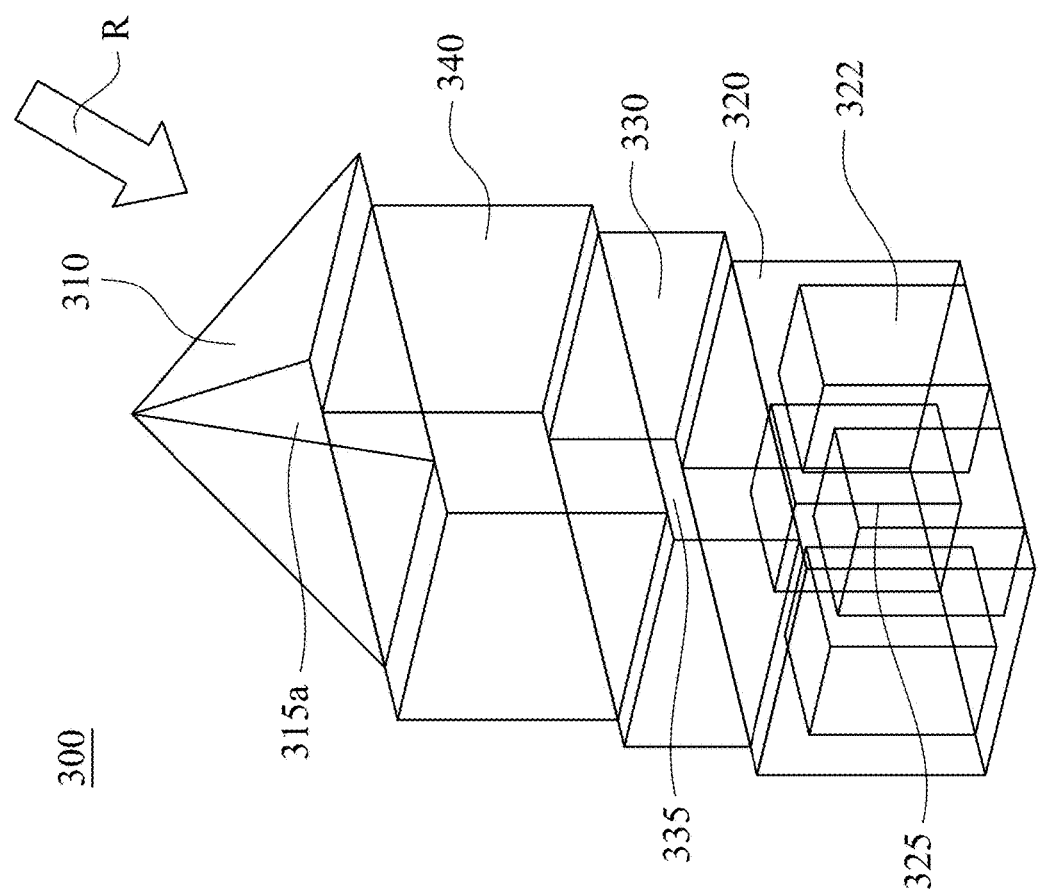
FIG. 19 is a schematic of a pixel array 300 according to one embodiment of the present disclosure.

FIG. 19 is a schematic of a pixel array 300 according to one embodiment of the present disclosure. The pixel array 300 includes a polyhedron structure 310, an under layer 340, a photo photoelectric conversion layer 320 having four photo diodes 322, and a color filter 330 located between the polyhedron structure 310 and the photo diodes 322. The polyhedron structure 310 is a pentahedron. An incident light travels along a ray direction R. A centroid 315a of the polyhedron structure 310a, a center 335 of the color filter 330, and a center 325 of the photo diodes 322 are arranged along the ray direction R of the incident light. In other words, all layers of the pixel array 300 are shifted based on a Chief Ray Angle (CRA). As such, the efficiency of the pixel array 300 can be improved.

FIG. 20A is a schematic of a light distribution on the polyhedron structure 310 according to one embodiment of the present disclosure. As shown in FIG. 20A, a normal N1 of the vertex 313 of the polyhedron structure 310 points toward a second direction (vertical direction) Y. The incident light L1 has a Chief Ray Angle of 30 degrees relative to the vertical direction Y (i.e., a direction of an optical axis). As shown by the range R1 and the range R2, the side facet 316A (shady side) is less exposed by the incident light, and the side facet 316B (bright side) is more exposed by the incident light. As a result, the amount of the light that can be refracted by the side facet 316A and the side facet 316B is uneven. In other words, energy distribution of the incident light L1 after passing through the polyhedron structure 310 is uneven.

FIG. 20B is a schematic of a light distribution on the polyhedron structure 310 according to one embodiment of the present disclosure. As shown in FIG. 20B, a normal N2 of the vertex 313a of the polyhedron structure 310a points toward a direction parallel with the ray direction R of the incident light L1. As a result, the range R3 and the range R4 are equal. Therefore, the side facet 316A and the side facet 316B of the polyhedron structure 310a are equally exposed by the incident light L1, and energy distribution of the incident L1 after passing through the polyhedron structure 310a is even. In some other embodiments, a normal of the top facet of the polyhedron structure is parallel with the ray direction R. Accordingly, the shift of the normal of the vertex or the top facet of the polyhedron structure based on the ray direction (i.e., CRA) can improve performance of the image sensor.

Figure 21B:
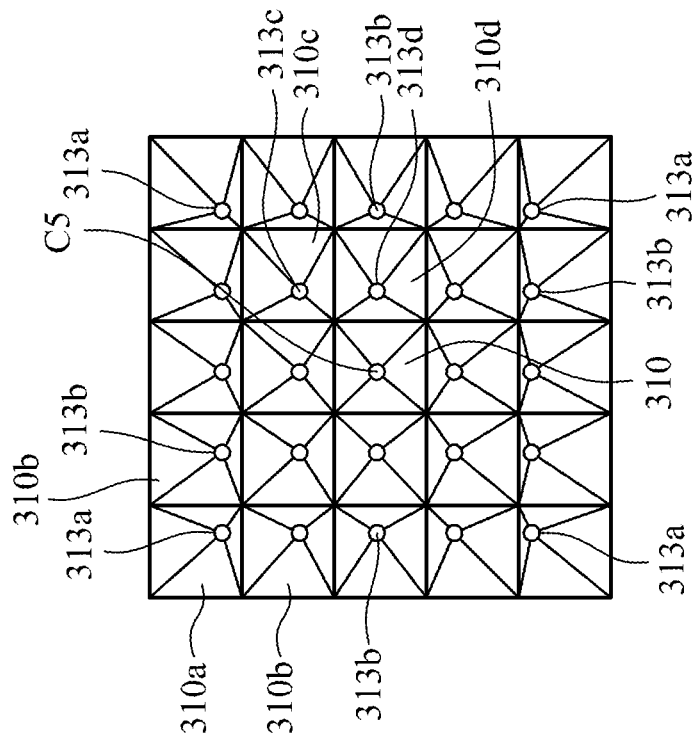
FIG. 21A and FIG. 21B are top views of an image sensor according to one embodiment of the present disclosure.
Figure 21A:
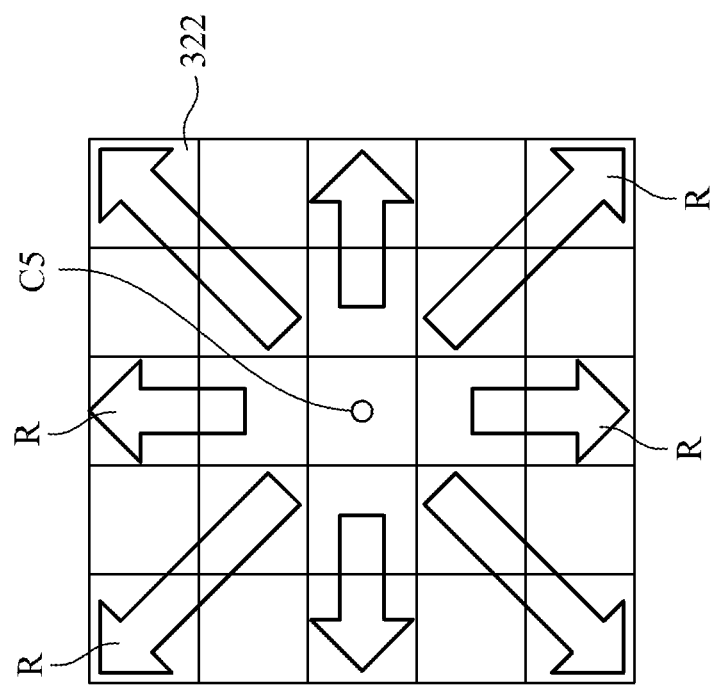

FIG. 21A and FIG. 21B are top views of an image sensor 30 according to one embodiment of the present disclosure. The image sensor 30 includes twenty-five photo diodes 322 arranged as a 5×5 array. Each photo diodes 322 overlaps with one polyhedron structure 310, 310a, 310b. The polyhedron structures are omitted in FIG. 21A. When an incident light travel towards the center C5 of the image sensor 30. Ray directions R relative to each photo diodes 322 are represented by arrows. Specifically, the CRA for each photo diodes 322 is greater when the distance between the center C5 and the photo diodes 322.

As shown in FIG. 21B, all the polyhedron structure 310a follow the rules demonstrated in FIG. 20B. For example, four polyhedron structures 310a located at the corners of the image sensor 30 have a CRA of 30 degrees as described in FIG. 20B. The vertexes 313a of the polyhedron structures 310a shift towards the center C5 of the image sensor 30. The nine polyhedron structures 310b located at the outer part of the image sensor and located between the polyhedron structure 310a have a CRA smaller than 30 degrees. The vertexes 313b of the polyhedron structures 310b shift towards the center C5. Similarly, the polyhedron structures 310c located at the corners of an inner part of the image sensor 30 have a smaller CRA, and therefore the shifts of the vertexes 313c are smaller. The polyhedron structures 310d located between the polyhedron structures 310c, and the shifts of the vertexes 313d are smaller than the shifts of the vertexes 313c. The polyhedron structure 310 located at the center C5 of the image sensor is substantially the same as the polyhedron structure 310 as shown in FIG. 20A. Accordingly, the further the polyhedron structures away from the center C5, the more the vertexes shift. As such, shifts of the vertexes form a concentric circle. With such design, the efficiency of the image sensor 30 can be improved.

Figure 22:
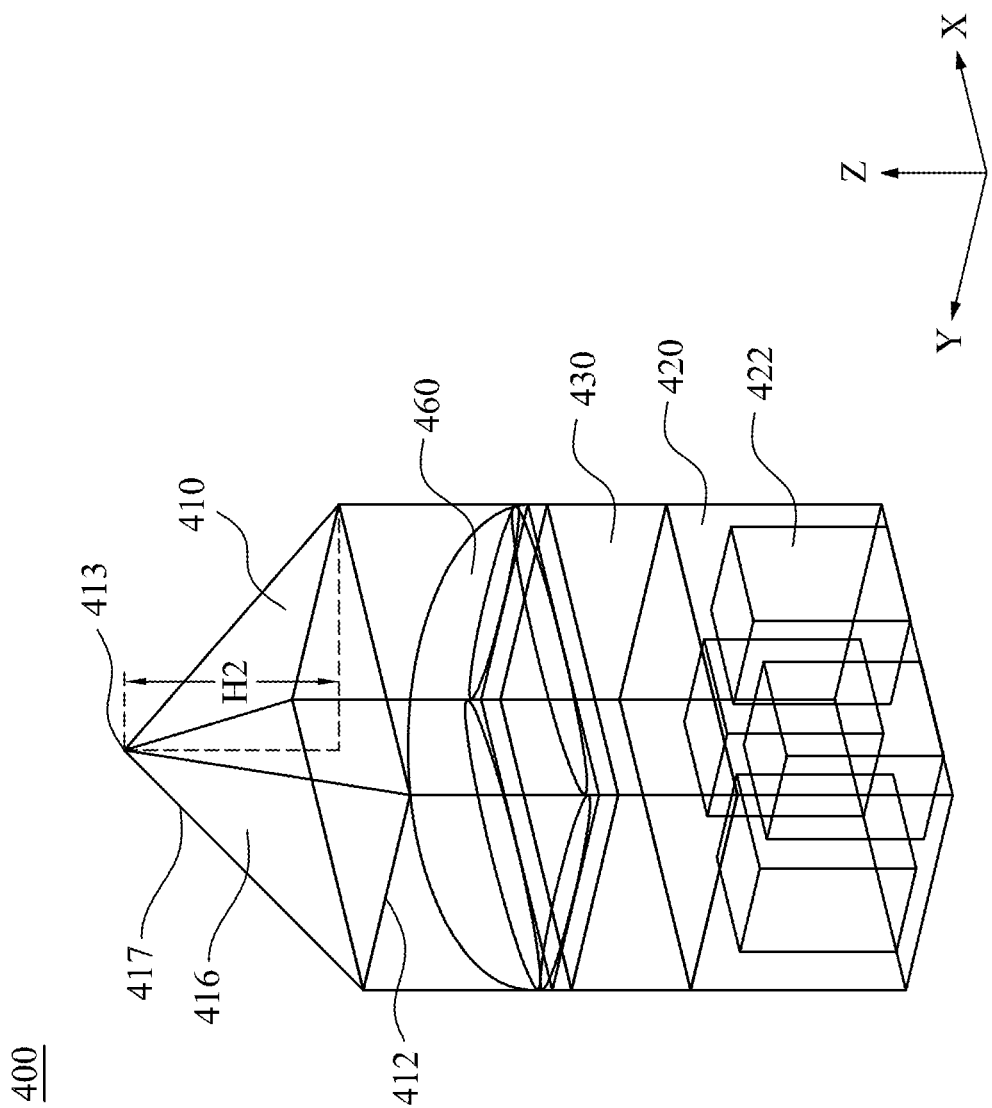
FIG. 22 is a schematic of a pixel array according to one embodiment of the present embodiment.

FIG. 22 is a schematic of a first pixel array 400 according to one embodiment of the present embodiment. The first pixel array 400 includes a polyhedron structure 410, a photo photoelectric conversion layer 420 having four photo diodes 422, a color filter 430 located between the polyhedron structure 410 and the photo diodes 422, and a micro lens 460 located between the polyhedron structure 410 and the color filter 430. The polyhedron structure 410 is a pentahedron. The light beams divided by the polyhedron structure 410 can be focused on the photo diodes 422 through the micro lens 460.

Figure 23:
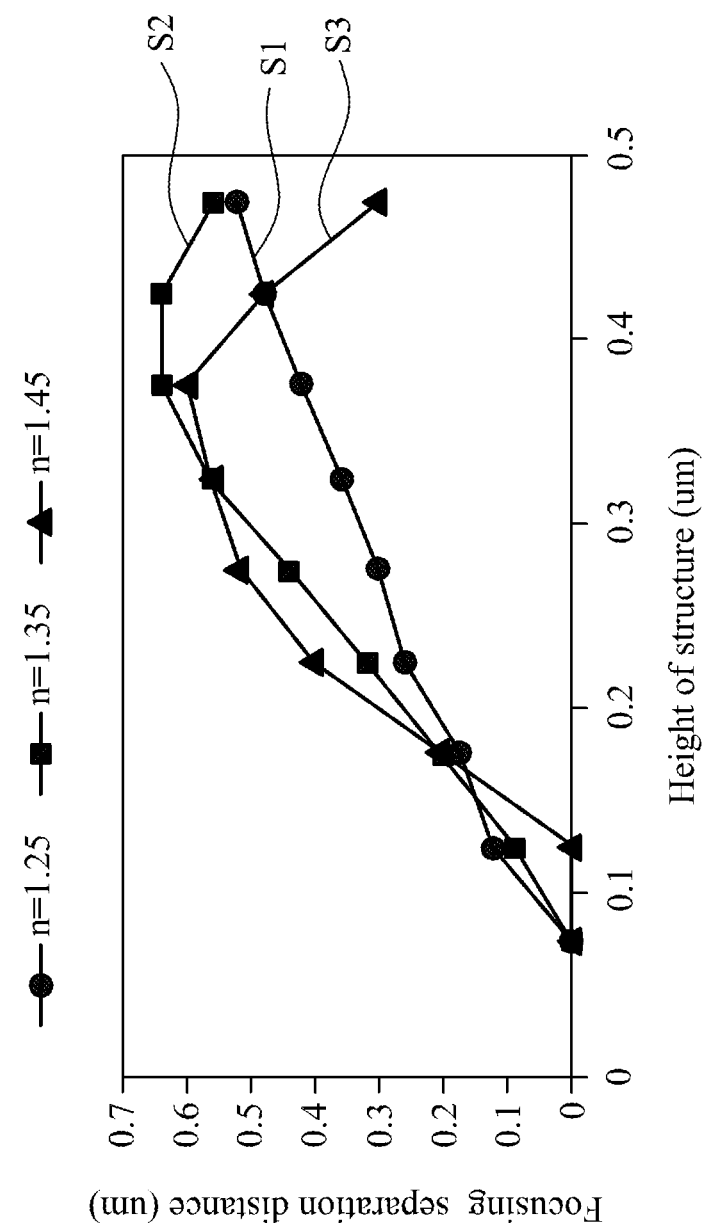
FIG. 23 is a plot of relation between focusing separation distance and a height of polyhedron structure.
Figure 24D:
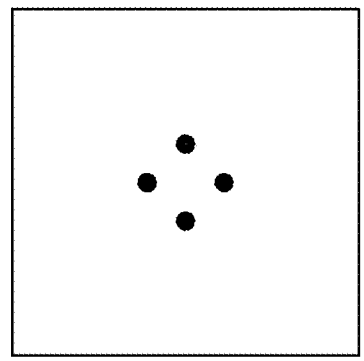
FIGS. 24A to 24D are illuminance diagrams of the photo diodes with various height of the polyhedron structure.
Figure 24C:
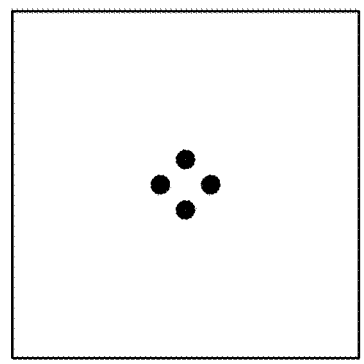
Figure 24B:
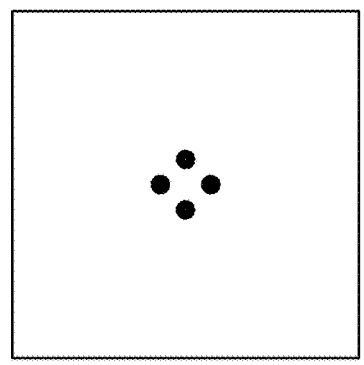
Figure 24A:
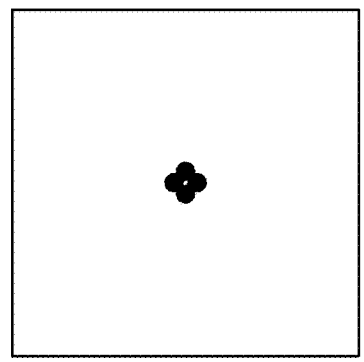

FIG. 23 is a plot of relation between focusing separation distance and a height H2 of polyhedron structure. As shown in FIG. 22, the height H2 is the distance between the bottom facet 412 and the vertex 413. The curves S1~S3 respectively represents the focusing separation distance when the refractive indexes of the polyhedron structure 410 are 1.25, 1.35, and 1.45, respectively. The refractive index of the micro lens 460 is 1.68. Accordingly, when the height H2 is fixed, suitable focusing separation distances can be determined by controlling the refractive index of the polyhedron structure 410.

FIGS. 24A to 24D are illuminance diagrams of the photo diodes 422 with various height H of the polyhedron structure 410. The illuminance diagrams in FIGS. 24A to 24D are derived when the height H2 (see FIG. 22) of the polyhedron structure 410 are 0.18 um, 0.28 um, 0.38 um, and 0.48 um, respectively. —Based on those results shown in FIG. 23 and FIGS. 24A to 24D, suitable focusing separation distances can be determined by controlling the height H2 and the refractive index of the polyhedron structure 410.

FIG. 25A and FIG. 25B are top views of image sensors according to some embodiments of the present disclosure. As shown in FIG. 25A, the image sensor 40a includes sixteen first pixel array 400 as shown in FIG. 22 arranged as a 4×4 array. The micro lenses 460 respectively overlap with the polyhedron structures 410. As shown in FIG. 25B, the image sensor 40b is similar to the image sensor 40a, and the difference is that each of the micro lenses 460 overlap with twenty-five photo diodes 422 which are arranged as a 5×5 array. In some other embodiments, the configuration of the photo diodes 422 under each of the micro lenses 460 can be different, such as a 3×3 array or a 4×4 array.

FIG. 26A and FIG. 26B are top views of image sensors according to some embodiments of the present disclosure. As shown in FIG. 26A, the image sensor 40c has nine micro lenses 460, nine polyhedron structures 410a, and eighty-one photo diodes 422 (i.e., eighty-one pixels). The micro lenses 460 respectively overlap with the polyhedron structures 410a. Each of the polyhedron structures 410a has eight side facets 416, a square bottom facet 412 and a circular top facet 414 that are similar to the polyhedron structure 110j shown in FIG. 10A. Each of the polyhedron structures 410a overlaps with nine photo diodes 422 arranged as a 3×3 array. Therefore, a sum of a number of the side facets 416 and a number of the top facet 414 of the polyhedron structure 410a equals to the number of the photo diodes 422.

As shown in FIG. 26B, the image sensor 40d has four micro lenses 460, four polyhedron structures 410b, and sixty-four photo diodes 422. The polyhedron structures 410b are similar to the polyhedron structures 110k shown in FIG. 10C. The micro lenses 460 respectively overlap with the polyhedron structures 410b. Each of the polyhedron structures 410b overlaps with sixteen photo diodes 422 arranged as a 4×4 array. Therefore, a number of the side facets 416 of the polyhedron structure 410b equals to the number of the photo diodes 422.

In the embodiments shown in FIG. 26A and FIG. 26B, the polyhedron structure 410a and the polyhedron structure 410b are prisms. The energy of an incident light can be distributed more uniformly to the one or more pixels underlying the top fact 414 and the pixels underlying the side facets 416.

FIG. 27A and FIG. 27B are top views of image sensors according to some embodiments of the present disclosure. As shown in FIG. 27A, the image sensor 40e includes fourteen first pixel arrays 400A and one second pixel array 400B. The first pixel array 400A is similar to the pixel array 400 shown in FIG. 22. The second pixel array 400B includes one micro lens 460a overlaps with eight photo diodes 422 arranged as a 4×2 array, and the second pixel array 400B has no polyhedron structure. As shown in FIG. 27B, the image sensor 40f includes twelve first pixel array 400A and one second pixel arrays 400B. The second pixel array 400B includes one micro lens 460a overlaps with sixteen photo diodes 422 arranged as a 4×4 array, and the second pixel array 400B has no polyhedron structure. The configuration of the image sensor 40e, 40f can be utilized for specific functions such as auto focus function.

Figure 28B:
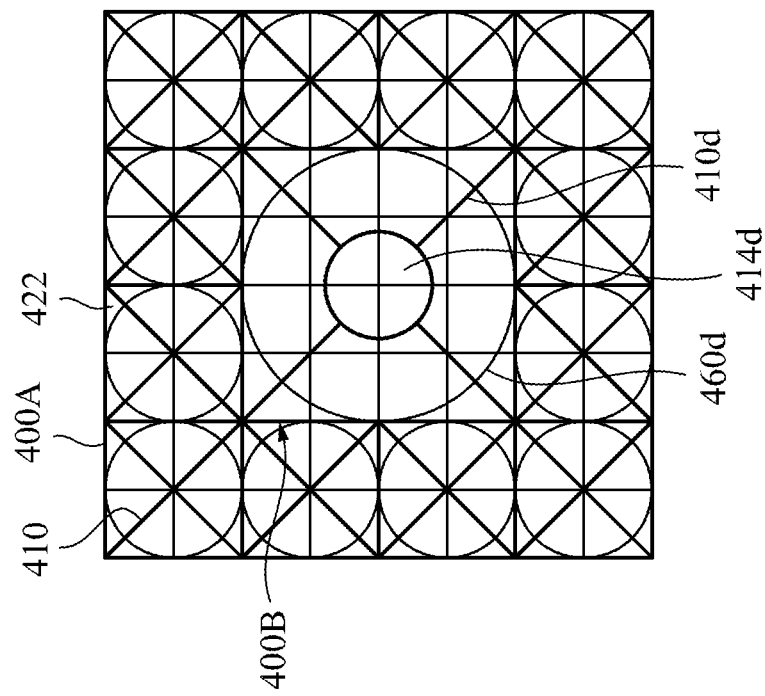
Figure 28A:
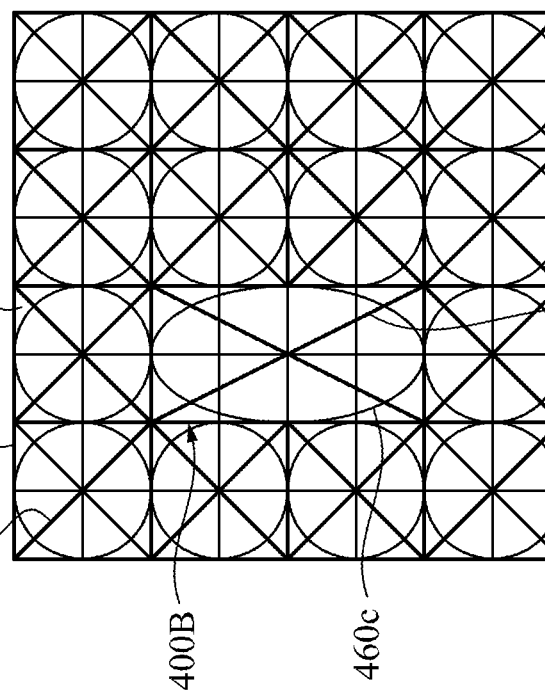
Figure 28C:
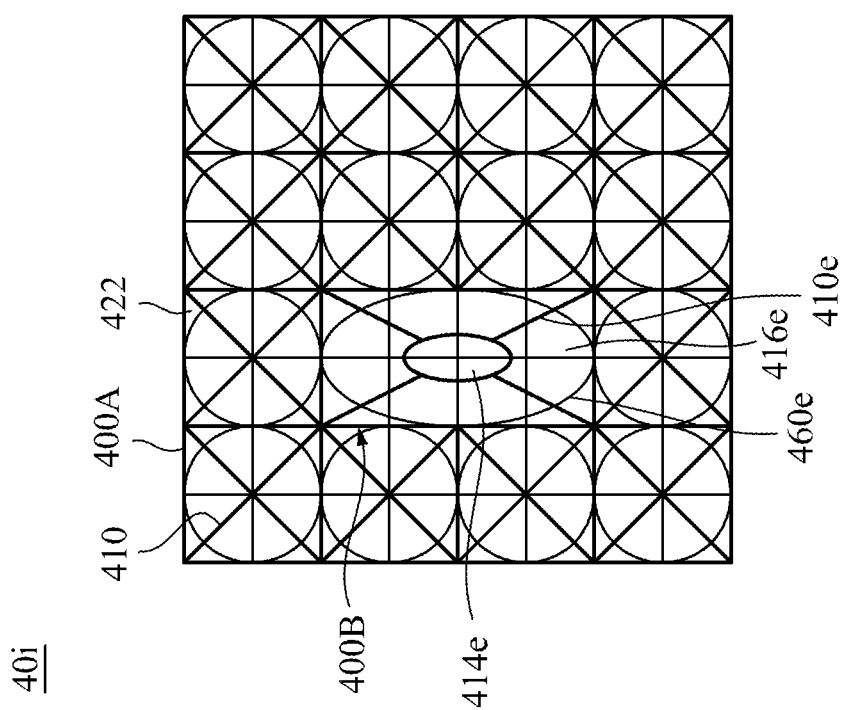

FIGS. 28A to 28C are top views of image sensors according to some embodiments of the present disclosure. As shown in FIG. 28A, the image sensor 40g includes fourteen first pixel array 400A and one second pixel array 400B. The first pixel array 400A is similar to the pixel array 400 shown in FIG. 22. The second pixel array 400B includes one polyhedron structure 410c, one micro lens 460c, and eight photo diodes 422 arranged as a 4×2 array. The micro lens 460c and the micro lens 410 have different shapes. A volume of the micro lens 460c is greater than a volume of the micro lens 460. The polyhedron structure 410c and the polyhedron structure 410 are both pentahedron, and a volume of the polyhedron structure 410c is greater than a volume of the polyhedron structure 410. In other words, a volume of the polyhedron structure 410 of the first pixel array 400A is different from a volume of the polyhedron structure 410c of the second pixel array 400B.

As shown in FIG. 28B, the image sensor 40h includes twelve first pixel array 400A and one second pixel array 400B. The second pixel array 400B includes one polyhedron structure 410d, one micro lens 460d, and sixteen photo diodes 422 arranged as a 4×4 array. A volume of the micro lens 460d is greater than a volume of the micro lens 460. The top facet 414d of the polyhedron structure 410d has a circular shape. In other words, the polyhedron structure 410d and the polyhedron structure 410 have different shapes.

As shown in FIG. 28C, the image sensor 40i includes fourteen first pixel array 400A and one second pixel array 400B. The second pixel array 400B has one polyhedron structure 410e, one micro lens 460e, and eight photo diodes 422 arranged as a 4×2 array. The polyhedron structure 410e has an elliptical top facet 414e and eight side facet 416e. The polyhedron structure 110n has an octagonal column shape. In other words, a number of the side facets 416 (see FIG. 22) of the polyhedron structure 410 of the first pixel array 100A is different from a number of the side facets 416e of the polyhedron structure 410e of the second pixel array 100B.

Figure 29B:
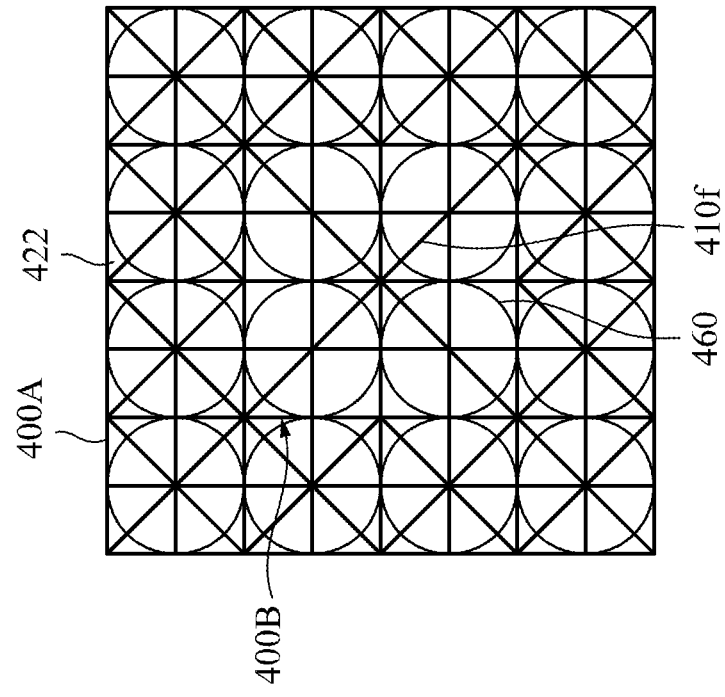
Figure 29A:
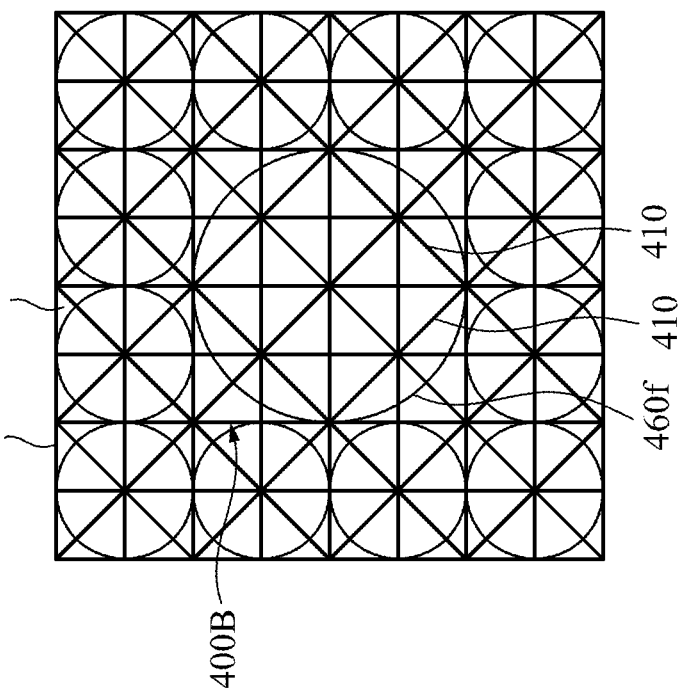

FIG. 29A and FIG. 29B are top views of image sensors according to some embodiments of the present disclosure. As shown in FIG. 29A, the image sensor 40i includes twelve first pixel array 400A and on second pixel array 400B. The first pixel array 400A is similar to the pixel array 400 shown in FIG. 22. The second pixel array 400B includes four polyhedron structures 410, one micro lens 460f, and sixteen photo diodes 422 arranged as a 4×4 array. In other words, a total number of the micro lens 460 and the micro lens 460f is different from a number of the polyhedron structures 410.

As shown in FIG. 29B, the image sensor 40j is similar to the image sensor 40i, and the difference is that the second pixel array 400B includes one polyhedron 410f and four micro lenses 460. In other words, a number of the micro lenses 460 is different from a total number of the polyhedron structures 410

Figure 30B:
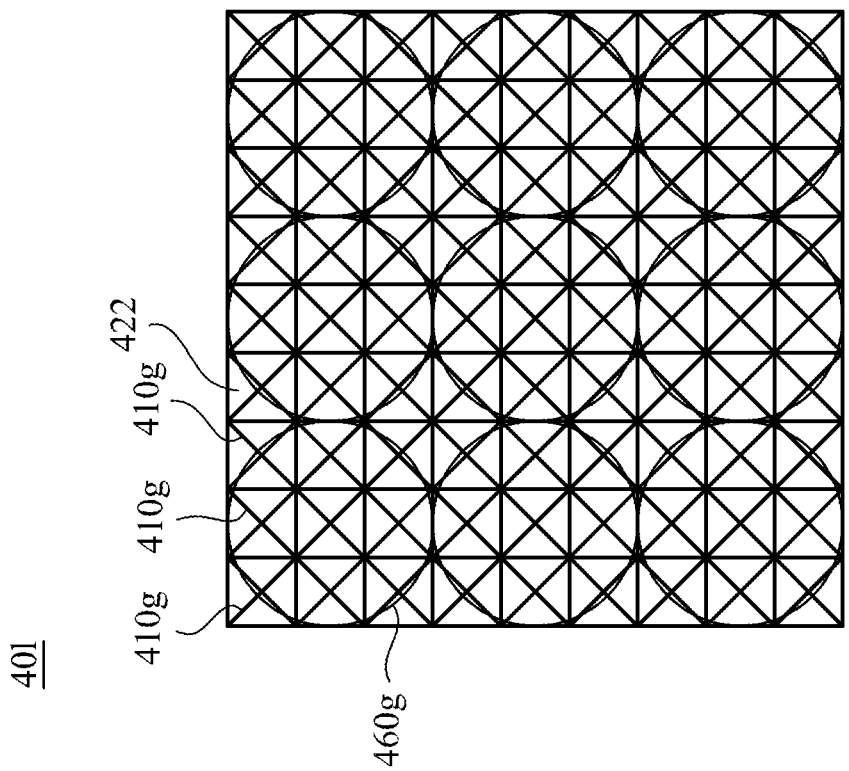
Figure 30A:
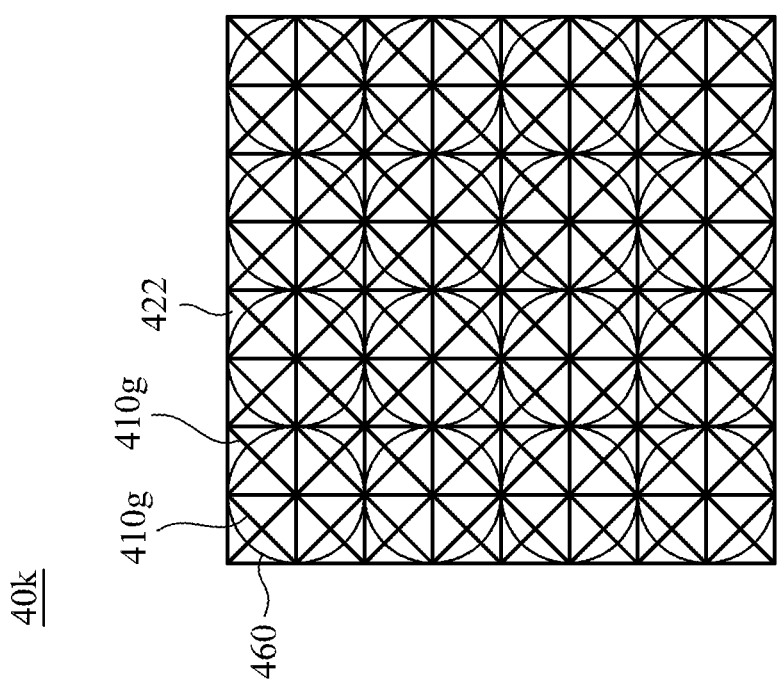

FIG. 30A and FIG. 30B are top views of image sensors according to some embodiments of the present disclosure. As shown in FIG. 30A, the image sensor 40k includes sixty-four polyhedron structures 410g and sixteen micro lenses 460. Each of the polyhedron structures 410g overlaps with one photo diodes 422 (i.e., one pixel). One micro lens 460 overlaps with four polyhedron structures 410g and four photo diodes 422. As shown in FIG. 30B, the image sensor 40I is similar to the image sensor 40k, and the difference is that each of the micro lens 460h overlaps with nine polyhedron structures and nine photo diodes 422.

FIGS. 31A to 31E are top views of color arrangement of the color filters of the image sensors according to some embodiments of the present disclosure. Reference is made to FIG. 22, and FIGS. 31A to 31E. The image sensors shown in FIGS. 31A to 31E all include four polyhedron structures 410 and four micro lenses 460 as described in FIG. 22. Each of the micro lenses 460 or the polyhedron structures 410 overlaps with multiple photo diodes 422, and a 2×2 array is demonstrated herein merely as an example.

Figures 31A, 31B, 31C, 31D, 31E:
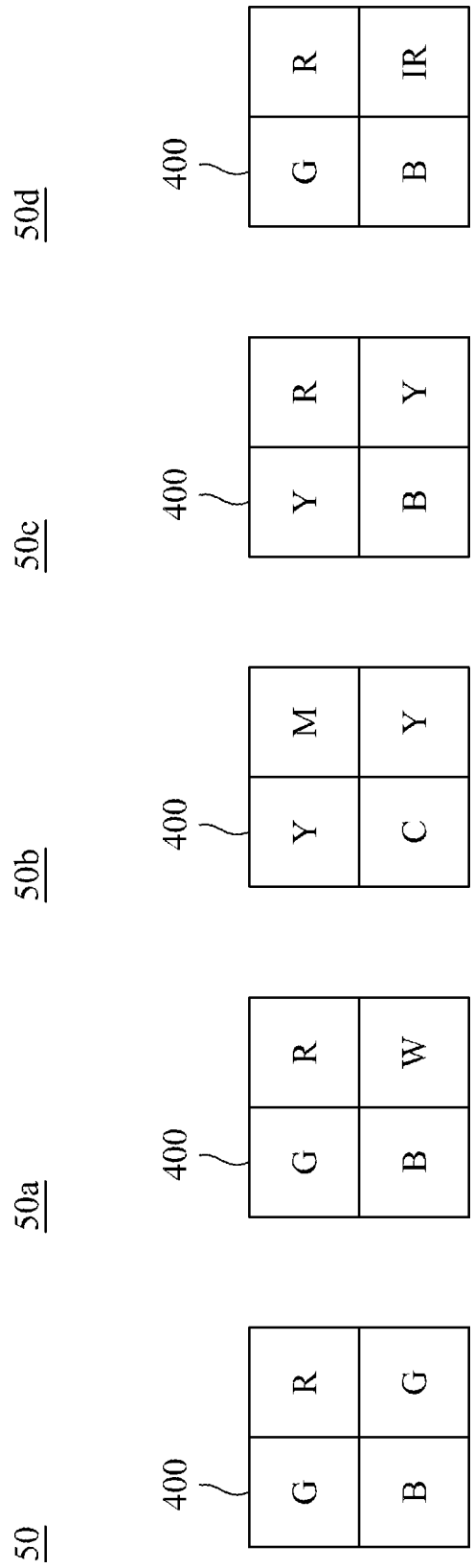

As shown in FIG. 31A, the image sensor 50 has a RGGB arrangement. That is the image sensor 50 includes color filters corresponding to red, green, and blue. As shown in FIG. 31B, the image sensor 50a has a RGBW arrangement. That is, the image sensor 50a includes color filters corresponding to red, green, blue, and white. As shown in FIG. 31C, the image sensor 50b has a CYYM arrangement. That is, the image sensor 50b includes color filters corresponding to cyan, yellow, and magenta. As shown in FIG. 31D, the image sensor 50c has a RYYB arrangement. That is, the image sensor 50c includes color filters corresponding to red, yellow, and blue. As shown in FIG. 31E, the image sensor 50d has a RGBIR arrangement. That is, the image sensor 50d includes color filters corresponding to red, green, blue, and infrared.

FIGS. 32A to 32D are top views of image sensors according to some embodiments of the present disclosure. As shown in FIG. 32A, the image sensor 50e includes four fifth pixel arrays 400e. Each of the fifth pixel arrays 400e includes four pixels and has a RGGB arrangement. In other words, the polyhedron structure 410 of each of the fifth pixel array 400e overlaps with four photo diodes 122 and four color filters including different colors (red, green, and blue). That is, an orthogonal projection of each of the polyhedron structure 410 overlaps with the color filters having at least three colors.

As shown in FIG. 32B, the image sensor 50f includes four third pixel arrays 400c. Each of the third pixel arrays 400c includes nine pixels and has single color. In other words, the polyhedron structure 410 of each of the third pixel arrays 400c is overlapped with nine photo diodes 422 and one color filter. The four third pixels arrays 400c of the image sensor 50f collectively form a RGGB arrangement as shown in FIG. 31A. In some other embodiments, the image sensor 50f can have other types of color arrangements such as those shown in FIGS. 31B to 31E.

As shown in FIG. 32C, the image sensor 50g includes four fourth pixel arrays 400d. Each of the fourth pixel arrays 400d includes sixteen pixels and has single color. In other words, the polyhedron structure 410 of each of the fourth pixel arrays 400d overlaps with sixteen photo diodes 422 and one color filter. The four fourth pixels arrays 400d of the image sensor 50g collectively form a RGGB arrangement as shown in FIG. 31A. In some other embodiments, the image sensor 50g can have other types of color arrangements such as those shown in FIGS. 31B to 31E.

As shown in FIG. 32D, the image sensor 50h includes four sixth pixel arrays 400f. Each of the sixth pixel arrays 400f is similar to the image sensor 50e shown in FIG. 32A, and the difference is that each of the sixth pixel arrays 400f has single color. In other words, four polyhedron structures 410 of each of the sixth pixel arrays 100f overlap with one color filter. That is, an orthogonal projection of more than one polyhedron structure 410 overlaps with one color filter. The four sixth pixels arrays 400f of the image sensor 50h collectively form a RGGB arrangement as shown in FIG. 31A. In some other embodiments, the image sensor 50h can have other types of color arrangements such as those shown in FIGS. 31B to 31E.

FIG. 33A is a partial top view of an image sensor according to one embodiment of the present disclosure. FIG. 33B is a cross-sectional view taken along line 33B-33B in FIG. 33A. As shown in FIG. 34A, a polyhedron structure 410h includes edges 417h formed between adjacent two of the side facets 416h. The photo diodes 422 are arranged along a first direction X (horizontal) and a second direction Y (vertical) perpendicular to the first direction X. Therefore, orthogonal projections of the edges 417h extend along the first direction X or the second direction Y.

Reference is made to FIG. 22 and FIG. 25A. Orthogonal projections of the edges 417 of the polyhedron structure 410 extend along the directions different from the first direction X or the second direction Y. In the embodiment in FIG. 22, the orthogonal projections of the edges 417 extend along diagonal directions. Therefore, comparing with the polyhedron structure 410 as shown in FIG. 22, the polyhedron structure 410h shown in FIG. 33A are rotated 90 degrees with a rotation axis parallel with the third direction Z. With such configuration, the side facets 416 face the photo diodes 422 so as to improve the focusing ability. As shown in FIG. 34B, two polyhedron structure 410h are connected together, and there is a side wall 419h located between adjacent two polyhedron structures 410h.

FIG. 33C and FIG. 33D are top view of image sensors according to some embodiments of the present disclosure. As shown in FIG. 33C, the image sensor 60 includes sixteen polyhedron structures 410h and sixteen micro lenses 460. Each of the polyhedron structure 410 and the micro lens 460 overlaps with four photo diodes 422. The edges 417 are extend along the first direction X and the second direction Y, and the vertexes 413 overlaps the centers of the micro lenses 460. The side wall 419h overlaps with an interface between two micro lens 460. As shown in FIG. 33D, the image sensor 60a is similar to the image sensor 60, and the difference is that each of the micro lenses 460 overlaps with twenty-five photo diodes 422. The image sensor 60a can has similar advantages as those of the image sensor 60, and the description is not repeated hereinafter.

Figure 34:
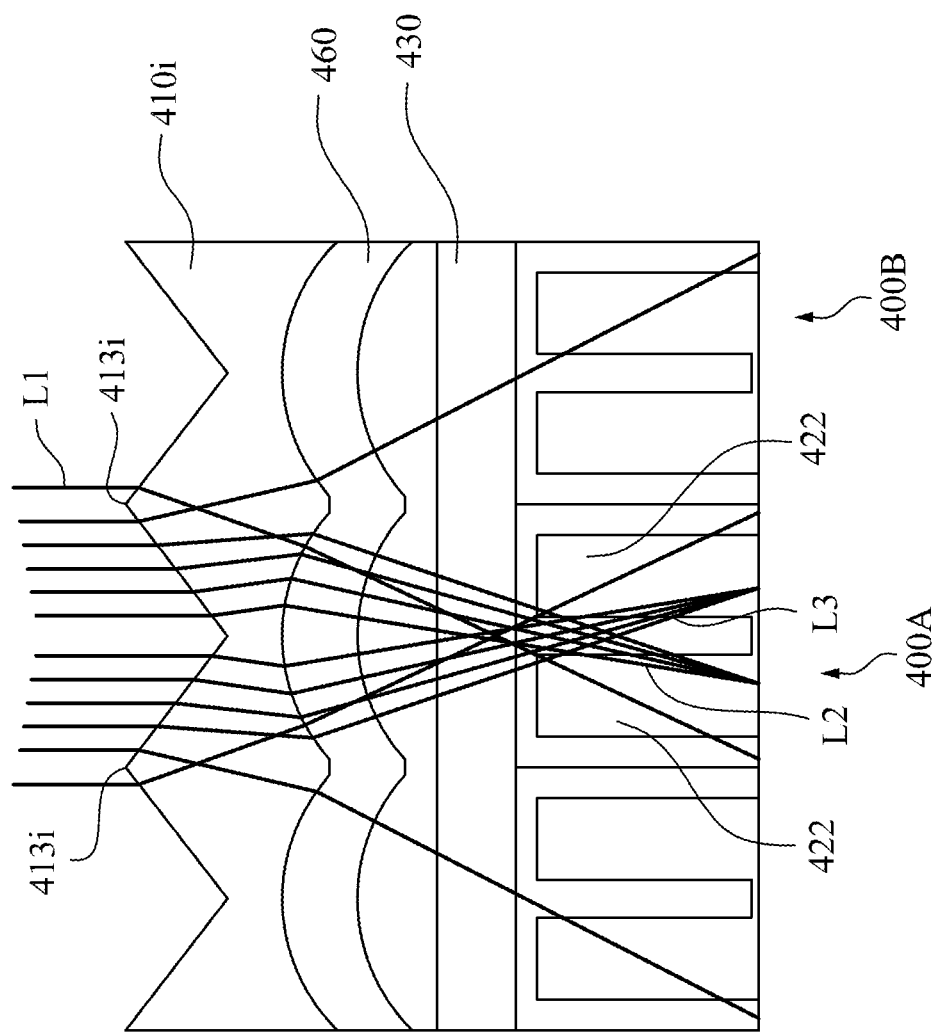
FIG. 34 is a schematic of optical path when an incident light traveling through the polyhedron structure.
Figure 35:
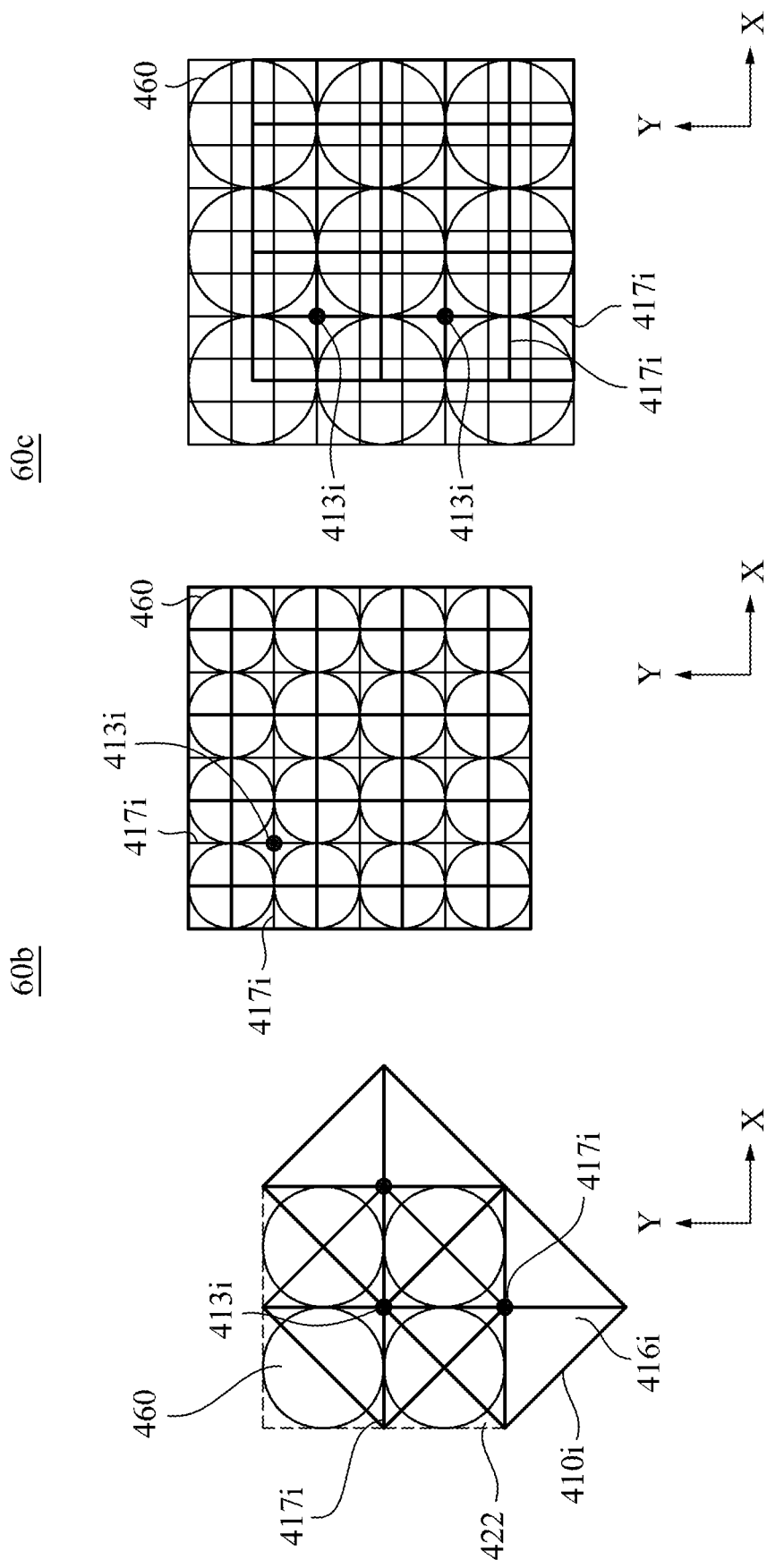
FIG. 35A is a partial top view of an image sensor according to one embodiment of the present disclosure.
FIG. 35B and FIG. 35C are top view of image sensors according to some embodiments of the present disclosure.
Figure 36:
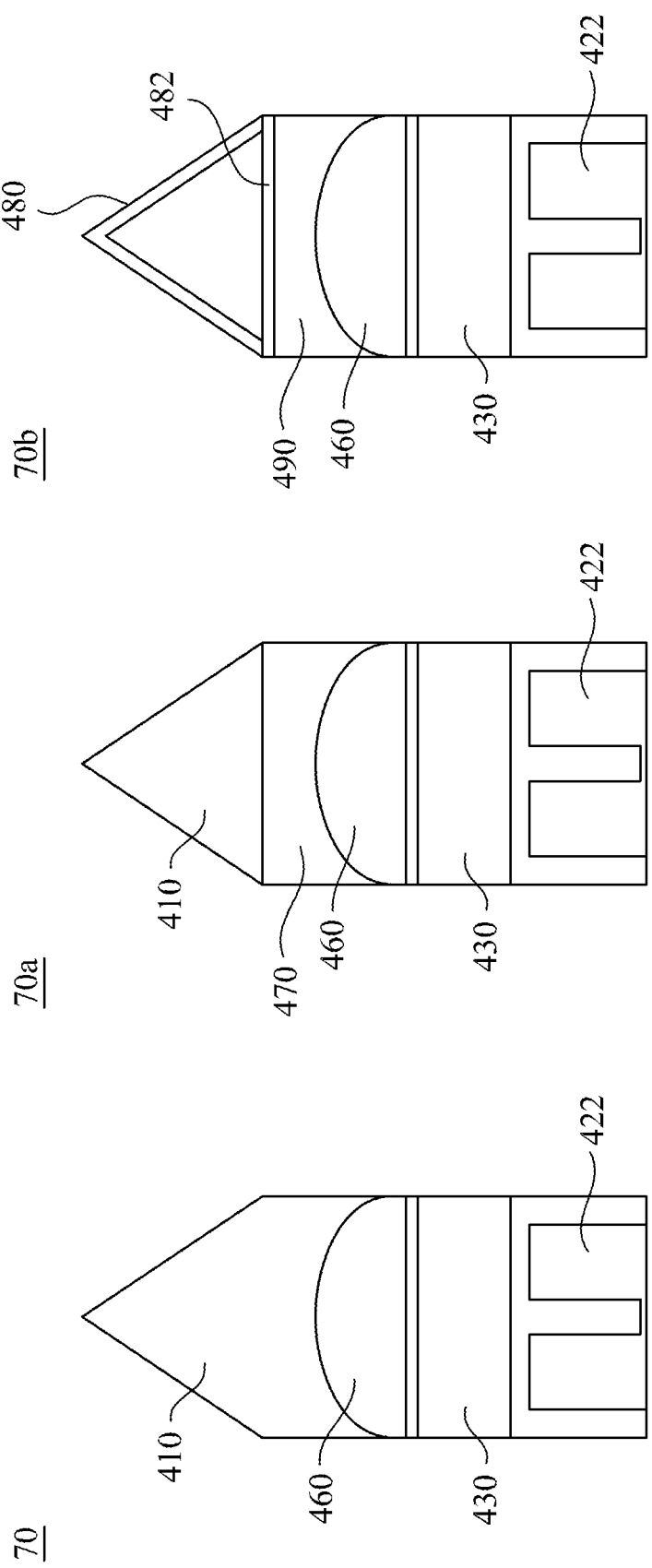
FIGS. 36A to 36C are cross-sectional view of pixel arrays according to some embodiments of the present disclosure.

FIG. 34 is a schematic of optical path when an incident light traveling through the polyhedron structure 410i. In the present embodiment, the vertex 413i of the polyhedron structure 410i is shifted. For example, an orthogonal projection of the vertex 413i is located between the first pixel array 400A and the second pixel array 400B. With such configuration, an incident light L1 can be divided into light beams L2, L3 focused in the photo diodes 422 to improve performance of the photo diodes 422. Therefore, the first pixel array 400A and the second pixel array 400B of the present embodiment can have the similar advantages as those of the pixel array 400 shown in FIG. 22, and the description is not repeated hereinafter.

FIG. 35A is a partial top view of an image sensor according to one embodiment of the present disclosure. FIG. 35B and FIG. 35C are top view of image sensors according to some embodiments of the present disclosure. As shown in FIG. 35A, a polyhedron structure 410i includes edges 417i formed between adjacent two of the side facets 416i. The polyhedron structure 410i partially overlaps with four micro lenses 460. A vertex 413i of the polyhedron structure 410i is located at the position surrounded by these four adjacent micro lenses 460.

As shown in FIG. 35B, the image sensor 60b includes sixteen polyhedron structures 410i and sixteen micro lenses 460. Each of the polyhedron structure 410i and the micro lens 460 overlaps with four photo diodes 422. The edges 417i are extend along the first direction X and the second direction Y, and the vertexes 413i are located at the position surrounded by four adjacent micro lenses 460. As shown in FIG. 35C, the image sensor 60c is similar to the image sensor 60b, and the difference is that each of the micro lenses 460i overlaps with nine photo diodes 422. The image sensor 60c can has similar advantages as those of the image sensor 60b, and the description is not repeated hereinafter.

FIGS. 36A to 36C are cross-sectional view of pixel arrays according to some embodiments of the present disclosure. As shown in FIG. 36A, the pixel array 70 includes a color filter 430, a micro lens 460, and a polyhedron structure 410. The polyhedron structure 410 is directly formed on the micro lens 460, and there is no other layer formed on the polyhedron structure 410. Under this condition, a refractive index of the micro lens 460 is greater than an refractive index of the polyhedron structure 410, and the refractive index of the polyhedron structure 410 is greater than 1.1 (i.e., the refractive index of air).

As shown in FIG. 36B, the pixel array 70a is similar to the pixel array 70, and the difference is that the pixel array 70a further includes an index matching layer 470 located between the micro lens 460 and the polyhedron structure 410. Under this condition, the refractive index of the index matching layer is smaller than the refractive index of the micro lens 460 and is greater than the refractive index of the polyhedron structure 410. As such, light transmission efficiency and performance of the photo diodes 422 can be improved.

As shown in FIG. 36C, the pixel array 70b is similar to the pixel array 70a, and the difference is that the pixel array 70b further includes a first antireflection layer 480, a second antireflection layer 482, and an index changing layer 490. The first antireflection layer 480 is coated on the polyhedron structure 410. The second antireflection layer 482 is located between the polyhedron structure 410 and the index changing layer 490. The index changing layer 490 is located between the second antireflection layer 482 and the micro lens 460. Under this condition, the refractive index of the polyhedron structure 410 is greater than the refractive index of the index changing layer 490 and is smaller than or equal to the refractive index of the micro lens 460. As such, light transmission efficiency and performance of the photo diodes 422 can be improved.

FIG. 37 is an electromagnetic field simulation result. Data in the first row represent the electric field distributions on the photo diodes of an image sensor having the pixel array 400 as shown in FIG. 22 when the wavelength of an incident light is 450 nm (blue), 550 nm (green), and 650 nm (red), respectively. Data in the second row represent the electric field distributions on the photo diodes of an image sensor having the pixel array as shown in FIG. 34. As shown in FIG. 37, the electric field distribution of the image sensor show multiple peaks, and positions of those peaks are correlated with the pixel arrangements. That is, energy of the incident light can be divided by the polyhedron structure of the image sensor based on the pixel arrangement. As such, the energy received by each photo diodes 422 is even. In addition, even there is a shift between the polyhedron structure and the micro lens or the photo diodes, performance of the photo diodes can still be improved.

In summary, the polyhedron structure is configured to divide an incident light into multiple light beams towards the photo diodes. In addition, a number of the light beam can be determined by a number of the side facets of the polyhedron structure. A position of the focus of the light beam can be determined by the area of the top facet of the polyhedron structure, the height of the polyhedron, or the refractive index of the polyhedron structure. As such, focuses of the light beams are positioned more correlated with positions of photo diodes. Therefore, performance of the photo diodes can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising a first pixel array, wherein the first pixel array comprises:
   a plurality of photo diodes; and
   a polyhedron structure located above the plurality of photo diodes, wherein the polyhedron structure is configured to divide an incident light into a plurality of light beams, and each of the plurality of light beams is respectively focused in each of the plurality of photo diodes;
   wherein the polyhedron structure comprises a bottom facet, a top facet, and at least one side facet, the bottom facet is located between the side facet and the photo diodes, an orthogonal projection of the polyhedron structure overlaps with the plurality of photo diodes, an area of the bottom facet is greater than an area of the top facet, a number of the side facets is greater than or equal to three, and a sum of a number of the side facets and a number of the top facet of the polyhedron structure is greater than or equal to the number of the plurality of photo diodes.

2. The image sensor of claim 1, wherein a refractive index of the polyhedron structure is greater than or equal to 1.1 and is smaller than a refractive index of the plurality of photo diodes, and the image sensor further comprises:
   an antireflection layer coated on the polyhedron structure, wherein a refractive index of the antireflection layer is greater than 1.1 and is smaller than the refractive index of the polyhedron structure.

3. The image sensor of claim 1, further comprising a second pixel array, wherein the second pixel array comprises a plurality of photo diodes, and the second pixel array has no polyhedron structure thereon.

4. The image sensor of claim 1, further comprising a second pixel array, wherein the second pixel array comprises a plurality of photo diodes and a polyhedron structure located on the plurality of photo diodes, and
   wherein a volume of the polyhedron structure of the first pixel array is different from a volume of the polyhedron structure of the second pixel array, an area of the bottom facet of the polyhedron structure of the first pixel array is different from an area of the bottom facet of the polyhedron structure of the second pixel array, or a number of the side facets of the polyhedron structure of the first pixel array is different from a number of the side facets of the polyhedron structure of the second pixel array.

5. The image sensor of claim 1, further comprising a second pixel array, wherein the second pixel array comprises a plurality of photo diodes and a polyhedron structure located on the plurality of photo diodes, and wherein
   when viewed in a plan view, a displacement between a center of the polyhedron structure of the first pixel array and a center of the first pixel array is different from a displacement between a center of the polyhedron structure of the second pixel array and a center of the second pixel array.

6. The image sensor of claim 1, wherein the first pixel array comprises a color filter located between the plurality of photo diodes and the polyhedron structure, and the image sensor further comprises:
   a second pixel array comprising a polyhedron structure, a color filter, and a plurality of photo diodes, wherein the color filter of the second pixel array is located between the plurality of photo diodes of the second pixel array and the polyhedron structure of the second pixel array; and
   a grid located between the color filter of the first pixel array and the color filter of the second pixel array, wherein an orthogonal projection of the polyhedron structure of the first pixel array overlaps with the color filter of the second pixel arrays and the grid.

7. The image sensor of claim 6, wherein the grid comprises a body portion and a metal layer portion located between the body portion and the plurality of photo diodes of the first and second pixel arrays.

8. The image sensor of claim 6, wherein a refractive index of the grid is greater than or equal to 1 and is smaller than 1.5.

9. The image sensor of claim 6, wherein the grid comprises a plurality of layers with different refractive indexes, and a material of one of the layers is different from another one of the layers.

10. The image sensor of claim 1, further comprising:
    a plurality of color filters located between the polyhedron structure and the plurality of photo diodes, wherein a color arrangement of the color filters comprises RGGB, RGBW, CYYM, RYYB, or RGBIR.

11. The image sensor of claim 1, further comprising:
    a second pixel array comprising a plurality of photo diodes and a polyhedron structure located on the plurality of photo diodes; and
    a color filter located between the plurality of photo diodes and the polyhedron structures of the first and second pixel arrays, and an orthogonal projection of at least one of the polyhedron structures of the first and second pixel arrays overlaps with the color filter.

12. The image sensor of claim 1, wherein the first pixel array further comprises a plurality of color filters, the color filters respectively correspond to the plurality of photo diodes, an orthogonal projection of the polyhedron structure overlaps with the color filters, and the color filters have at least three colors.

13. The image sensor of claim 1, wherein the first pixel array further comprises a color filter located between the plurality of photo diodes and the polyhedron structure, a normal of the top facet of the polyhedron structure is parallel with a ray direction of an incident light, and when viewed in a cross-sectional view, a center of the polyhedron structure, a center of the color filter, and a center of the plurality of photo diodes are arranged along a ray direction of the incident light.

14. The image sensor of claim 1, further comprising:
at least one micro lens located between the plurality of photo diodes and the polyhedron structure, a refractive index of the polyhedron structure is greater than 1.1 and is smaller than a refractive index of the micro lens; and
a plurality of second pixel arrays, wherein each of the second pixel array comprises a plurality of photo diodes and a polyhedron structure located on the plurality of photo diodes, and a number of the micro lens is different from a total number of the polyhedron structures of the first pixel array and the second pixel array.

15. The image sensor of claim 1, further comprising a second pixel array, wherein the second pixel array comprises a plurality of photo diodes and a micro lens located on the plurality of photo diodes, and the second pixel array has no polyhedron structure thereon in a plan view.

16. The image sensor of claim 1, wherein the first pixel array further comprises a plurality of micro lenses, and the polyhedron structure overlaps with the micro lenses in a plan view.

17. The image sensor of claim 1, further comprising a second pixel array and, wherein the second pixel array comprises a plurality of photo diodes and a polyhedron structure located on the plurality of photo diodes; and
a micro lens located on the plurality of photo diodes of the first pixel array and the plurality of photo diodes of the second pixel array, and wherein the polyhedron structure of the first pixel array and the polyhedron structure of the second pixel array overlap with the micro lens in a plan view.

18. The image sensor of claim 1, wherein the polyhedron structure comprises a plurality of edges between adjacent two of the side facets, and when viewed in a plan view, the plurality of photo diodes are arranged along a first direction and a second direction perpendicular to the first direction, and orthogonal projections of the edges extend along the first direction or the second direction.

19. The image sensor of claim 1, wherein the polyhedron structure comprises a plurality of edges between adjacent two of the side facets, and when viewed in a plan view, the plurality of photo diodes are arranged along a first direction and a second direction perpendicular to the first direction, and extending directions of the orthogonal projections of the edges are different from the first direction and the second direction.

20. An image sensor, comprising:
a first pixel array, comprising:
a plurality of photo diodes; and
a polyhedron structure located above the plurality of photo diodes, wherein the polyhedron structure is configured to divide an incident light into a plurality of light beams, and each of the plurality of light beams is respectively focused in each of the plurality of photo diodes, and wherein the polyhedron structure of the first pixel array comprises a bottom facet, a top facet, and at least one side facet, the bottom facet of the first pixel array is located between the side facet and the photo diodes of the first pixel array, and an orthogonal projection of the polyhedron structure of the first pixel array overlaps with the plurality of photo diodes of the first pixel array; and
a second pixel array comprising:
a plurality of photo diodes; and
a polyhedron structure located on the plurality of photo diodes, wherein a volume of the polyhedron structure of the first pixel array is different from a volume of the polyhedron structure of the second pixel array, an area of the bottom facet of the polyhedron structure of the first pixel array is different from an area of the bottom facet of the polyhedron structure of the second pixel array, or a number of the side facets of the polyhedron structure of the first pixel array is different from a number of the side facets of the polyhedron structure of the second pixel array.

* * * * *